(12) United States Patent
Inaba

(10) Patent No.: US 6,914,808 B2
(45) Date of Patent: Jul. 5, 2005

(54) MAGNETORESISTIVE RANDOM ACCESS MEMORY DEVICE

(75) Inventor: Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/701,468

(22) Filed: Nov. 6, 2003

(65) Prior Publication Data

US 2004/0141368 A1 Jul. 22, 2004

(30) Foreign Application Priority Data

Dec. 27, 2002 (JP) ........................................ 2002-382393

(51) Int. Cl.[7] .............................................. G11C 11/00
(52) U.S. Cl. ........................ 365/158; 365/207; 365/210
(58) Field of Search ................................ 365/158, 207, 365/210, 189.01, 205

(56) References Cited

U.S. PATENT DOCUMENTS

| 5,946,227 A | | 8/1999 | Naji | |
|---|---|---|---|---|
| 5,986,925 A | | 11/1999 | Naji et al. | |
| 6,621,729 B1 | * | 9/2003 | Garni et al. | 365/158 |

FOREIGN PATENT DOCUMENTS

JP  2002-25245  1/2002

OTHER PUBLICATIONS

Roy Scheuerlein, et al., "A 10ns Read and Write Non–Volatile Memory Array Using a Magnetic Tunnel Junction and FET Switch in each Cell", IEEE International Solid–State Circuits Conference, Digest of Technical Papers, Feb. 2000, 8 pages.

M. Durlam, et al., "Nonvolatile RAM Based on Magnetic Tunnel Junction Elements", IEEE International Soilid–State Circuits Conference, Digest of Technical Papers, Feb. 2000, 7 pages.

Peter K. Naji, et al., "A 256kb 3.0V 1T1MTJ Nonvolatile Magnetoresissistive RAM", IEEE International Solid–State Circuits Conference, Digest of Technical Papers, Feb. 2001, 9 pages.

Kouichi Yamada, et al., "A Novel Sensing Scheme for a MRAM with a 5% MR Ratio", Symposium of VLSI Circuits Digest of Technical Papers, Session C12–1, Jun. 2001, 2 Pages.

* cited by examiner

Primary Examiner—David Lam
(74) Attorney, Agent, or Firm—Oblon, Spivak, McClelland, Maier & Neustadt, P.C.

(57) ABSTRACT

In an MRAM, a plurality of magnetic memory cells are arranges in rows and columns. Each of the plurality of magnetic memory cells is a magnetoresistive element having a tunnel magnetoresistive effect. Each of the plurality of magnetic memory cells includes two magnetoresistive elements that hold data items of opposite logic levels to each other and are connected in series.

40 Claims, 18 Drawing Sheets

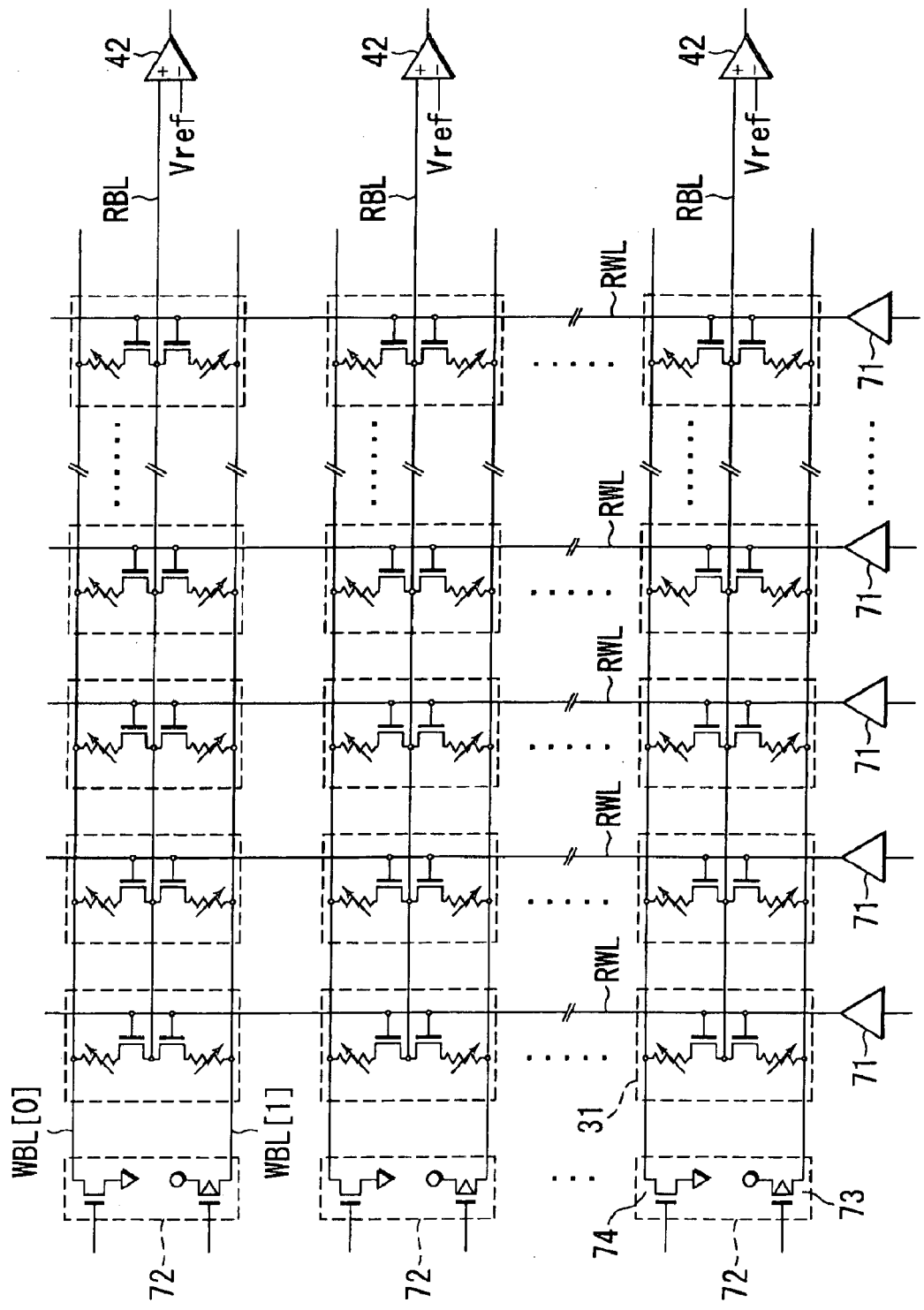
F I G. 22

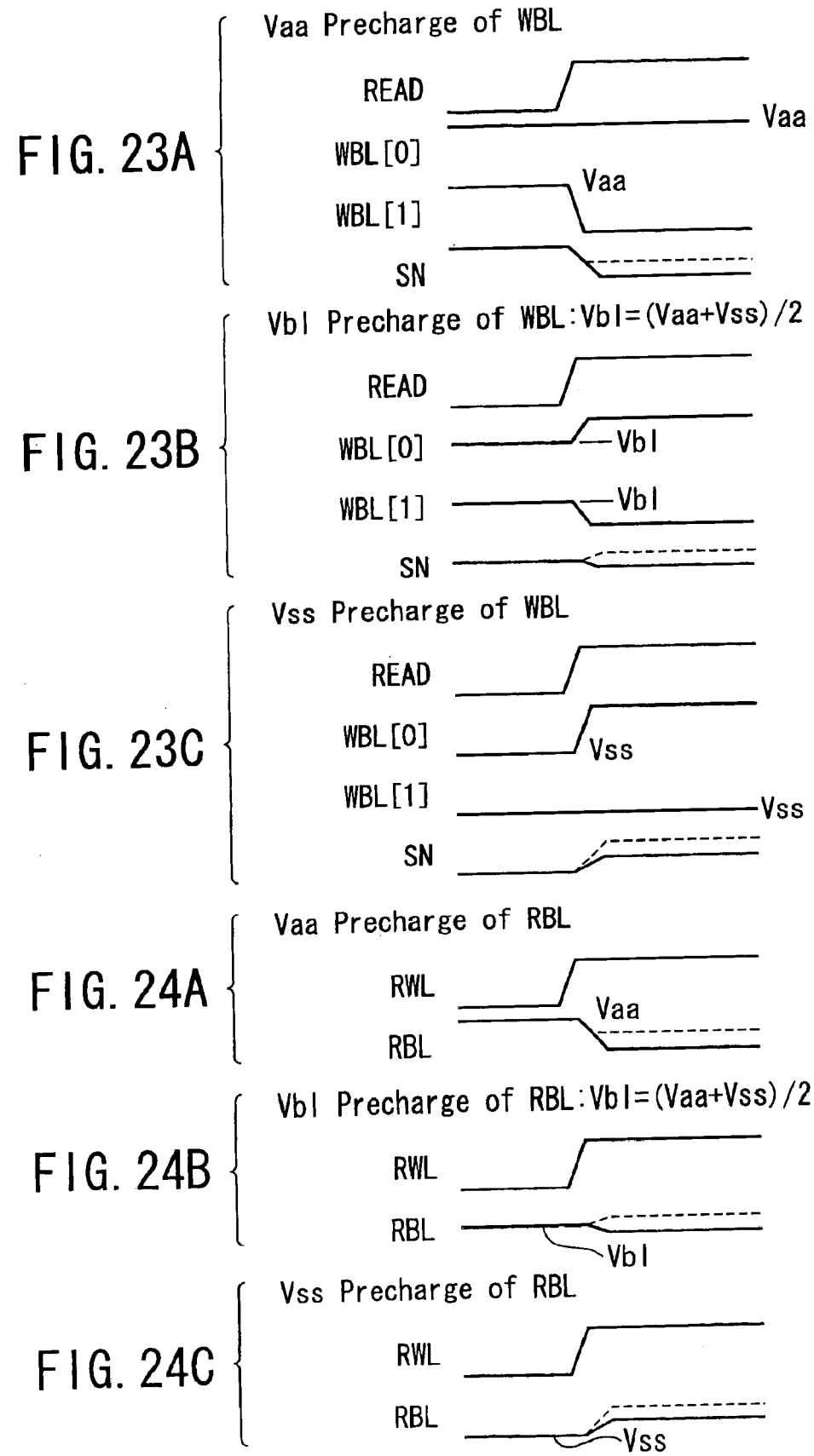

TO FIRST MRAM DATA REWRITE CONTROLLER

MAGNETORESISTIVE RANDOM ACCESS MEMORY DEVICE

CROSS-REFERENCE TO RELATED APPLICATIONS

This application is based upon and claims the benefit of priority from the prior Japanese Patent Application No. 2002-382393, filed Dec. 27, 2002, the entire contents of which are incorporated herein by reference.

BACKGROUND OF THE INVENTION

1. Field of the Invention

This invention relates to a semiconductor memory device, and more particularly to a Magnetoresistive Random Access Memory (MRAM) using MTJ (Magnetic Tunnel Junction) elements utilizing tunneling magnetoresistive effect as memory cells.

2. Description of the Related Art

MRAMs storing data by the magnetoresistive effect feature nonvolatility, high-speed operation, high integration, and high reliability. Therefore, MRAMs are expected to be used as rewritable memory devices, in place of DRAMs or EEPROMs. They are now being developed at present. MRAMs have been disclosed in, for example, U.S. Pat. No. 5,986,925, entitled "MAGNETORESISTIVE RANDOM ACCESS MEMORY DEVICE PROVIDING SIMULTANEOUS READING OF TWO CELLS AND OPERATING METHOD," issued Nov. 16, 1999, assigned to Motorola, Inc., U.S. Pat. No. 5,946,227, entitled "MAGNETORESISTIVE RANDOM ACCESS MEMORY WITH SHARED WORD AND DIGIT LINES," issued Aug. 31, 1999, assigned to Motorola, Inc., a nonvolatile semiconductor memory device and an information recording method disclosed in Jpn. Pat. Appln. KOKAI Publication No. 2002-25245 (P2002-25245A), published in Japan, Jan. 25, 2002, Roy Scheuerlein, et al., "A 10-ns Read and Write Non-Volatile Memory Array Using a Magnetic Tunnel Junction and FET Switch in each Cell," 2000 ISSCC Digest of Technical Papers, pp. 128–129, February 2000, M. Durlam, et al., "Nonvolatile RAM based Magnetic Tunnel Junction Elements," 2000 ISSCC Digest of Technical Papers, pp. 130–131, February 2000, Peter K. Naji, et al., "A 256-Kb 3.0-V 1T1MTJ Nonvolatile Magnetoresistive RAM," 2001 ISSCC Digett of Technical Papers, pp. 122–123, February 2001, or Kouichi Yamada, et al., "A Novel Sensing Scheme for a MRAM with a 5% MR ratio," 2001 Symposium on VLSI Circuits Digest of Technical Papers, Session C12-1, June 2001.

An MTJ element used as a memory cell in an MRAM has an insulating film sandwiched between two ferromagnetic films and features the Tunneling Magnetoresistive Effect. In the effect, the magnitude of the tunnel current with the spin directions of the individual ferromagnetic films parallel with each other differs from that with the spin directions nonparallel with each other. When the spin directions become parallel with each other, the tunnel current becomes larger, resulting in a decrease in the resistance of the MTJ element. When the spin directions become nonparallel, the tunnel current becomes smaller, resulting in an increase in the resistance of the MTJ element. The MRAM stores "0" data when the resistance of the MTJ element is low and "1" data when the resistance is high.

FIG. 1 is an equivalent circuit diagram of a typical 1Tr-1MTJ magnetic memory cell in an MRAM disclosed in, for example, FIG. 8.2.1(b) in the paper by Roy Scheuerlein, et al.

A memory cell 11 is composed of an MTJ element 12 and a select transistor 13 connected in series with each other. One end of the MTJ element 12 is connected to a bit line BL. One end of the transistor 13 is connected to the ground potential GND. A write word line is indicated by WWL and a read word line is indicated by RWL.

FIG. 2 is a schematic sectional view of the magnetic memory cell shown in FIG. 1.

A semiconductor substrate 14 is divided into a plurality of element regions by element isolating regions 15 composed of STI (Shallow Trench Isolation). A select transistor 13 is formed in one element region. Numeral 16 indicates a gate oxide film of the select transistor 13, numerals 17, 17 indicate diffusion layers serving as the source and drain of the transistor 13, and numeral 18 indicates the gate electrode of the transistor 13. Each M0 indicates a first interconnection layer, each M1 indicates a second interconnection layer, M2 indicates a third interconnection layer, each CD indicates a contact connecting the first interconnection layer M0 and the diffusion layer 17, C1 indicates a contact connecting the second interconnection layer M1 and the first interconnection layer M0, MX indicates an MTJ connect interconnection layer, and CX indicates a contact connecting the MTJ connect interconnection layer MX and the second interconnection layer M1. In FIG. 2, WWL, RWL, BL, and GND represent the uses of the respective interconnection layers. That is, WWL indicates a write word line, RWL indicates a read word line, BL indicates a bit line, and GND indicates the ground electrode. As shown in FIG. 2, the bit line BL and the write word line WWL are arranged in such a manner that they extend so as to cross each other at right angles.

When data is written into the memory cell 11, current is caused to flow through the bit line BL and the write word line WWL to generate a resultant magnetic field in the MTJ element, thereby writing the data. When the data is read from the memory cell 11, the read word line RWL is activated and current is caused to flow from the bit line BL to the ground electrode GND, thereby reading the data by a sense amplifier connected to the bit line BL.

Here, consider a case where the data is read from a conventional magnetic memory cell.

FIG. 3A is a conceptual diagram to help explain a method of causing a constant current to flow through a magnetic memory cell, converting the data from the magnetic memory cell into voltage, and reading the data in voltage.

In FIG. 3A, numeral 21 indicates a constant current source, 22 a voltmeter, 11 a magnetic memory cell, Rmc the resistance of the magnetic memory cell 11, and i a current flowing through the magnetic memory cell 11. The voltage value Vsignal indicated by the voltmeter 22 is Vsignal= Rmc×i, that is, the product of the current i flowing in the magnetic memory cell 11 and the resistance Rmc of the magnetic memory cell 11.

FIG. 3B is a conceptual diagram to help explain a method of applying a constant voltage to the magnetic memory cell, converting the data from the magnetic memory cell into current, and reading the data in current.

In FIG. 3B, numeral 23 indicates a constant voltage source, 24 an ammeter, 11 a magnetic memory cell, Rmc the resistance of the magnetic memory cell 11, and v a voltage applied to the magnetic memory cell 11.

The current value Isignal indicated by the ammeter 24 is Isignal=v/Rmc, that is, the quotient obtained by dividing the voltage v applied to the magnetic memory cell 11 by the resistance Rmc of the magnetic memory cell 11.

As seen from the read voltage or read current equations, the amount of signal read from the magnetic memory cell depends on the absolute value of the resistance Rmc of the magnetic memory cell in the conventional reading method. This causes the following problem: when the resistance of the MTJ element differs from one memory chip to another, the variation has a direct effect on the amount of read signal.

There is another problem: the amount of read signal varies, depending on the parasitic resistance of the path that allows a current to pass through the magnetic memory cell or the path that applies a voltage. That is, since the distance between the sense amplifier and the constant current source or constant voltage source differs, depending on the position of the magnetic memory cell in the memory cell array, the absolute value of the read-out signal differs from one memory cell to another even in, for example, the same column, which becomes a problem.

Therefore, there has been a need to stabilize the amount of read signal from the magnetic memory cells, regardless of variations in the resistances of the magnetic memory cells or the positions of the magnetic memory cells in the memory cell array, enable a large-scale array configuration, while preventing an increase in the data read speed, and reduce the chip area and the chip cost.

BRIEF SUMMARY OF THE INVENTION

According to an aspect of the present invention, there is provided a magnetoresistive random access memory device including: a magnetic memory cell which includes a first magnetoresistive element, a second magnetoresistive element and at least one transfer gate connected in series to the first and second magnetoresistive element, each of the first and second magnetoresistive element having a tunnel magnetoresistive effect and the first and second magnetoresistive element being inserted between both ends of the magnetic memory cell; a pair of first bit lines connected to the magnetic memory cell; a first word line disposed so as to face closely to the magnetic memory cell; and a second bit line connected to the magnetic memory cell.

BRIEF DESCRIPTION OF THE SEVERAL VIEWS OF THE DRAWING

FIG. 22 is a circuit diagram showing a part of the memory cell array in an MRAM according to an tenth embodiment of the prevent invention and a part of a peripheral circuit;

FIGS. 23A, 23B, and 23C are waveform diagrams each showing an example of potential waveforms of the important parts including a write bit line used in reading the data from a magnetic memory cell in each of the first to tenth embodiments;

FIGS. 24A, 24B, and 24C are waveform diagrams each showing an example of potential waveforms of the important parts including a read bit line used in reading the data from a magnetic memory cell in each of the first to tenth embodiments;

DETAILED DESCRIPTION OF THE INVENTION

Figure 1:
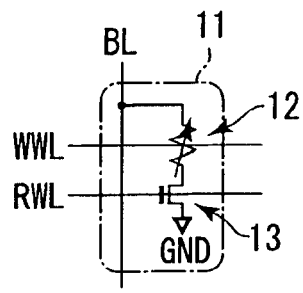
FIG. 1 is an equivalent circuit diagram of a magnetic memory cell in a conventional MRAM.
Figure 2:
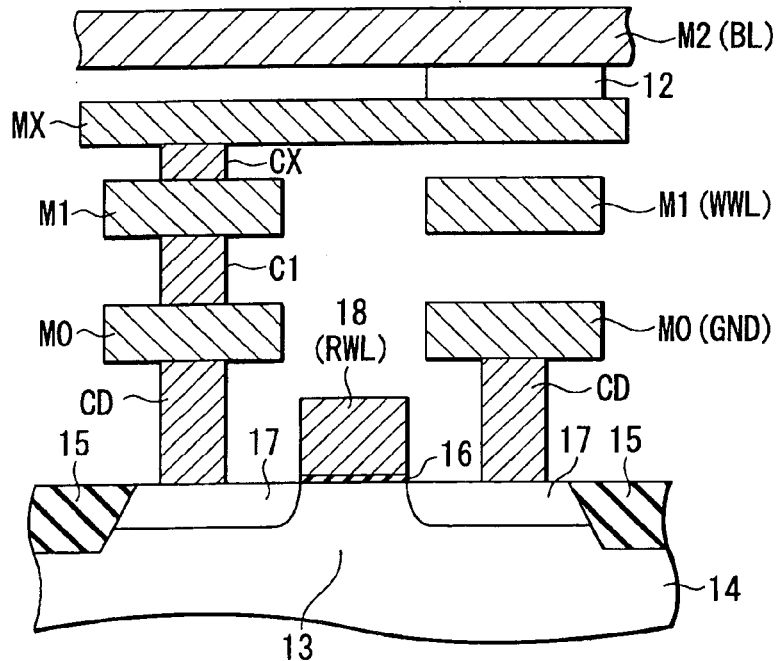
FIG. 2 is a schematic sectional view of the magnetic memory cell shown in FIG. 1.
Figure 3A:
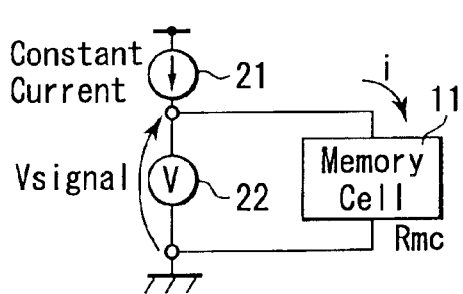
FIGS. 3A and 3B are circuit diagrams conceptually showing a method of reading the data from a conventional magnetic memory cell.
Figure 3B:
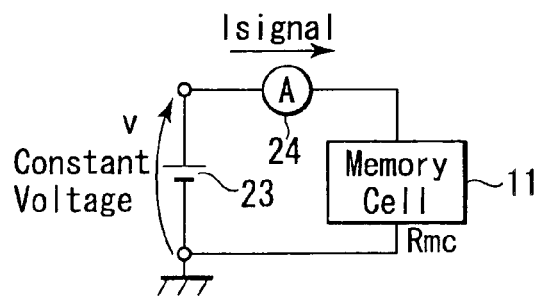

Hereinafter, referring to the accompanying drawings, embodiments of the present invention will be explained in detail. In each embodiment explained below, the same parts are indicated by the same reference numerals and a redundant explanation will be avoided.

<First Embodiment>

Figure 4:
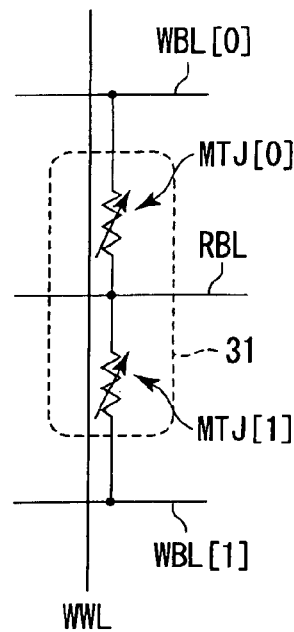
FIG. 4 is an equivalent circuit diagram of a magnetic memory cell in a memory cell array in an MRAM according to a first embodiment of the present invention.

FIG. 4 is an equivalent circuit diagram of a magnetic memory cell in a memory cell array of an MRAM according to a first embodiment of the present invention.

The configuration of a magnetic memory cell 31 is such that two MTJ elements MTJ[0] and MTJ[1] each having a tunneling magnetoresistive effect are connected in series between both ends. That is, the magnetic memory cell 31 in the MRAM of the first embodiment is of the 2MTJ type. In this case, data which is stored in the MTJ element MTJ[0] is opposite logic level to data which is stored in the MTJ element MTJ[1]. In the explanation below, when the two MTJ elements MTJ[0], MTJ[1] are represented without a distinction between them, they are indicated by MTJ.

WBL[0] and WBL[1] are write bit lines for writing data into the magnetic memory cell 31. One write bit line WBL[0] is connected to one end of one MTJ element MTJ[0]. The other write bit line WBL[1] is connected to one end of the other MTJ element MTJ[1]. A write word line WWL is disposed so as to face closely to the magnetic memory cell 31. The write word line WWL is used to select the magnetic memory cell 31 when data is written. The other ends of one and the other MTJ elements MTJ[0], MTJ[1] are connected to a common junction node. To the common junction node, a read bit line RBL is connected. When data is read from the magnetic memory cell 31, the data is read onto the read bit line RBL.

The write bit lines WBL[0], WBL[1] are arranged parallel to each other. The write word line WWL is arranged in a direction perpendicular to the write bit lines. With the write bit lines WBL[0], WBL[1] crossing the write word line WWL as described above, the MTJ elements MTJ[0], MTJ[1] can be arranged at the intersections of the write bit lines WBL[0], WBL[1] and the write word line WWL.

Generally, a cell array unit is composed of a memory cell array where a plurality of magnetic memory cells 31 are arranged in a matrix, a plurality of write word lines WWL, a plurality of pairs of bit lines WBL[0], WBL[1]. A plurality of cell array units are stacked one on top of another, thereby forming a cell array stacked structure.

When data is written into the magnetic memory cell 31, current is caused to flow through the write word line WWL and the write bit lines WBL[0], WBL[1], thereby producing a resultant magnetic field. The resultant magnetic field makes the directions of the spins in the MTJ elements MTJ[0], MTJ[1] opposite (parallel or anti-parallel) to each other, thereby writing data. In this case, current flowing in a specific direction is caused to flow through the write word line WWL, whereas currents flowing in opposite directions are caused to flow through the write bit lines WBL[0], WBL[1].

When data is read from the magnetic memory cell 31, a potential of V0 is applied to one write bit line WBL[0] and a potential of V1 different from V0 is applied to the other write bit line WBL[1], thereby applying a specific potential difference between both ends of the magnetic memory cell 31. At this time, the potential determined by the ratio of the resistance of the MTJ element MTJ[0] or MTJ[1] to the combined resistance of the MTJ elements MTJ[0] and MTJ[1] is read as the data onto the read bit line RBL.

Next, the amount of read signal will be described. If the resistance of the MTJ element in which "1" data has been stored is Ra and the resistance of the MTJ element in which "0" data has been stored is Rp, the change rate MR ratio of the resistance before and after a specific magnetic field is applied to the MTJ element is expressed as: $(Ra-Rp)Rp = (Ra/Rp)-1$, where Ra is defined as $Ra=(1+MR) \times Rp$.

When the data stored in one MTJ element MTJ[0] is "0" and the data stored in the other MTJ element MTJ[1] is "1", this is defined as data "1" being stored in the magnetic memory cell 31. When the data stored in one MTJ element MTJ[0] is "1" and the data stored in the other MTJ element MTJ[1] is "0", this is defined as data "0" being stored in the magnetic memory cell 31. When the stored data in the magnetic memory cell 31 is "1" a potential of Vsig1 on the read bit line RBL is given by $$V\text{sig1} = \{Ra/(Ra+Rp)\} \times (V0-V1) \tag{1}$$

Similarly, when the stored data in the magnetic memory cell 31 is "0" a potential of Vsig0 on the read bit line RBL is given by $$V\text{sig0} = \{Rp/(Ra+Rp)\} \times (V0-V1) \tag{2}$$

When these equations (1) and (2) are rewritten using the change rate MR, this gives $$V\text{sig1} = \{(1+MR)/(2+MR)\} \times (V0-V1) \tag{3}$$

$$V\text{sig0} = \{(1/(2+MR))\} \times (V0-V1) \tag{4}$$

The average value of Vsig0 and Vsig1, that is, a reference potential Vref in reading is given by $$V\text{ref} = (V\text{sig0}+V\text{sig1})/2 = (V0-V1)/2 \tag{5}$$

Specifically, in the magnetic memory cell 31, two MTJ elements are connected in series. The data stored in one MTJ element is opposite to the data stored in the other MTJ element. To read the data from the magnetic memory cell 31, a potential difference is applied between both ends of the magnetic memory cell 31 and the potential at the junction node of the two MTJ elements is read. Therefore, the value of the read signal does not depend on the absolute values of the resistances of the two MTJ elements, but is determined by the resistance ratio of the two MTJ elements.

According to this principle, the absolute value of the read-out signal voltage does not change, even when the resistances of the MTJ elements vary from one memory chip to another. This assures a specific margin for reading and eliminates the need to adjust the sense route circuit chip by chip.

The reference potential input to the sense amplifier does not depend on the resistance of the MTJ elements and can be set to ½ of the potential difference applied between both ends of the memory cell, that is, the middle potential between "1" data and "0" data. Therefore, it is not necessary to adjust the reference potential chip by chip, even when the resistances of the MTJ elements vary from one chip to another.

Furthermore, in a read operation, the feedback circuit, such as a constant current source or a voltage clamp circuit, needed in a conventional equivalent is not required.

Consequently, the sense circuit becomes simple, resulting in a decrease in the layout area of the core circuit. For example, when a latch sense amplified is used as in a DRAM, such a function as burst reading can be realized.

<Second Embodiment>

Figure 5:
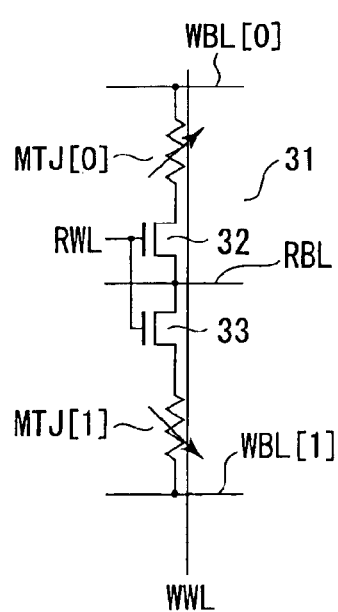
FIG. 5 is an equivalent circuit diagram of a magnetic memory cell in a memory cell array in an MRAM according to a second embodiment of the present invention.

FIG. 5 is an equivalent circuit diagram of a magnetic memory cell in a memory cell array of an MRAM according to a second embodiment of the present invention.

The magnetic memory cell of the second embodiment differs from the 2MTJ magnetic memory cell of the first embodiment in that a cell select transfer gate 32 is inserted between the other end of one MTJ element MTJ[0] and the read bit line RBL and a cell select transfer gate 33 is inserted between the other end of the other MTJ element MTJ[1] and the read bit line RBL. NMOSFETs are used as the two transfer gates 32, 33. Each gate electrode is connected to the read word line RWL. A series connection node of the two cell select transfer gates 32, 33 serves as a data read node, which is connected to the read bit line RBL.

That is, the magnetic memory cell 31 in the MRAM of the second embodiment is a 2Tr-2MTJ memory cell composed of two MTJ elements and two MOSFETs.

The operation of the magnetic memory cell 31 in FIG. 5 is basically the same as that of the magnetic memory cell in FIG. 4 except that the on/off states of the two cell select transfer gates 32, 33 are controlled by the read word line RWL.

In the second embodiment, when the on resistances of the transfer gates 32, 33 are sufficiently small, the value of the read signal is determined by the resistance ratio of the two MTJ elements as in the first embodiment.

As described above, in the MRAM of the second embodiment, one transfer gate is provided between the read word line RBL and each MTJ element. This makes it possible to isolate the activated or selected magnetic memory cells from the deactivated or unselected magnetic memory cells in the cell array so that circulating current via the read bit line RBL may be cut off, which realizes a reliable read operation.

Figure 6:
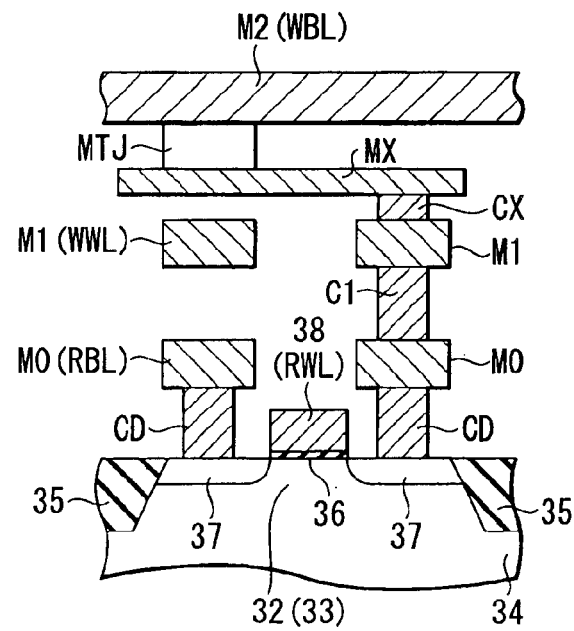
FIG. 6 is a schematic sectional view of the element structure of a part of the memory cell shown in FIG. 5.

FIG. 6 is a schematic sectional view of the element structure of a part of the 2Tr-2MTJ memory cell shown in FIG. 5.

The cell select transfer gate 32 or 33 is formed in an active region divided by element isolating regions 35 composed using STI (Shallow Trench Isolation) formed in a semiconductor substrate 34. Numeral 36 indicates the gate oxide film of the transfer gate 32 or 33. Numerals 37, 37 indicate diffusion layers acting as the source and drain of the transfer gate 32 or 33 and 38 indicates the gate electrode of the transfer gate 32 or 33. Each M0 indicates a first interconnection layer, each M1 a second interconnection layer, M2 a third interconnection layer, each CD a contact connecting the first interconnection layer M0 and the diffusion layer 37, C1 a contact connecting the second interconnection layer M1 and the first interconnection layer M0, MX an MTJ connect interconnection layer, and CX a contact connecting the MTJ connect interconnection layer MX and the second interconnection layer M1.

In FIG. 6, WWL, RWL, WBL, and RBL represent the uses of the respective interconnection layers. That is, WLL indicates a write word line, RWL indicates a read word line, WBL indicates a write bit line, and RBL indicates the read bit line.

As shown in FIG. 6, the write word line WWL and the write bit line WBL are arranged in such a manner that they cross each other at right angles. The MTJ elements are arranged at the intersections of the write word line WWL and the write bit lines WBLs in a one-to-one correspondence. FIG. 6 shows a case where the read bit line RBL and the write bit line WBL are arranged in parallel to each other.

In FIG. 6, the write word line WWL is composed of a second interconnection layer M1, a lower interconnection provided below the MJT element and the write bit line WBL is composed of a third interconnection layer M2, an upper interconnection of the MJT element. This embodiment is not limited to this. For instance, this embodiment may be applied to another interconnection structure.

Figure 7A:
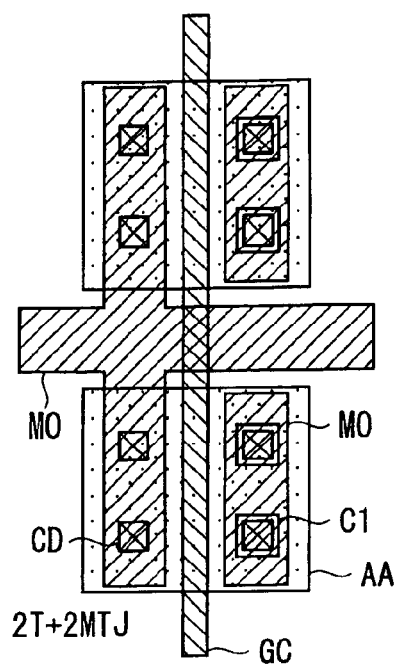
FIGS. 7A and 7B each show an example of a different plane layout of the memory cell shown in FIG. 5.
Figure 7B:
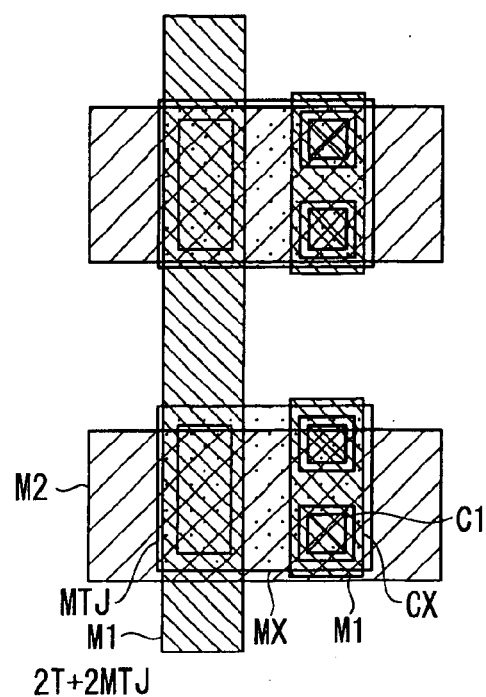

FIG. 7A shows a plane layout of contact C1 and the layer lower than contact C1 in FIG. 6. FIG. 7B shows a plane layout of contact C1 and the layer higher than contact C1 in FIG. 6. Here, AA in FIG. 7A indicates an active region divided by the element isolating regions 35 and GC corresponds to the gate electrode 38 of the cell select transfer gate 32 or 33.

<Modification of Second Embodiment>

Figure 8:
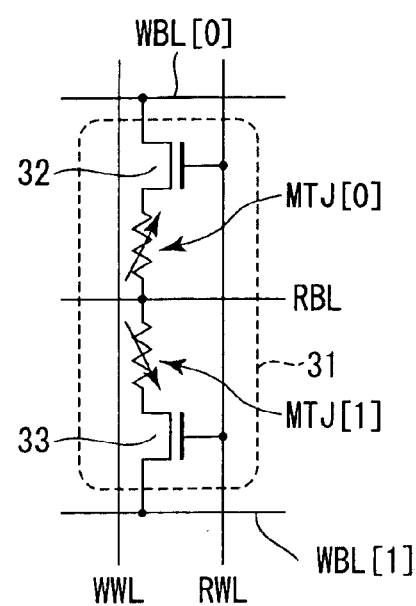
FIG. 8 is an equivalent circuit diagram of a magnetic memory cell in a memory cell array of an MRAM according to a modification of the second embodiment.

FIG. 8 is an equivalent circuit diagram of a magnetic memory cell in a memory cell array of an MRAM according to a modification of the second embodiment.

The magnetic memory cell of FIG. 8 is the same as that of FIG. 5 except that a cell select transfer gate 32 is inserted on the side of the write bit line WBL[0] for one MTJ element MTJ[0] and a cell select transfer gate 33 is inserted on the side of the write bit line WBL[1] for the other MTJ element MTJ[1] and that a series connection node of the two MTJ elements MTJ[0] and MTJ[1] acts as a data read node.

<Third Embodiment>

Figure 9:
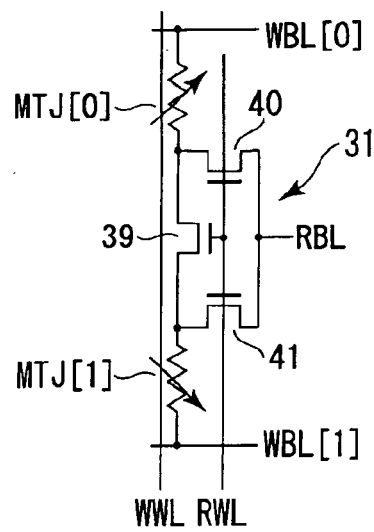
FIG. 9 is an equivalent circuit diagram of a magnetic memory cell in a memory cell array of an MRAM according to a third embodiment of the present invention.

FIG. 9 is an equivalent circuit diagram of a magnetic memory cell in a memory cell array of an MRAM according to a third embodiment of the present invention.

The magnetic memory cell of FIG. 9 is a 3Tr-2MTJ magnetic memory cell composed of two MTJ elements and three transfer-gate NMOSFETs. In the magnetic memory cell 31, a cell select transfer gate 39 is inserted between the MTJ elements MTJ[0] and MTJ[1], one end of a first read transfer gate 40 is connected to the junction node of the MTJ element MTJ[0] and one end of the transfer gate 39, and one end of a second read transfer gate 41 is connected to the junction node of the MTJ element MTJ[1] and the cell select transfer gate 39. The other ends of the two read transfer gates 40, 41 are connected equally to the bit line RBL. The gate electrodes of the transfer gates 39, 40, 41 are connected to the read word line RWL.

The operation of the 3Tr-2MTJ magnetic memory cell shown in FIG. 9 is basically the same as that of the 2MTJ magnetic memory cell in FIG. 4 except that the on/off states of the three cell select transfer gates 39, 40, 41 are controlled by a signal of the read word line RWL.

As described above, the transfer gate 39 is inserted between the MTJ elements MTJ[0] and MTJ[1] and the transfer gates 40, 41 are provided between each MTJ element MTJ and the read bit line RBL. This makes it possible to isolate the activated memory cells from the deactivated memory cells in the cell array so that circulating current via the read bit line RBL may be cut off, which realizes a reliable read operation.

Figure 10:
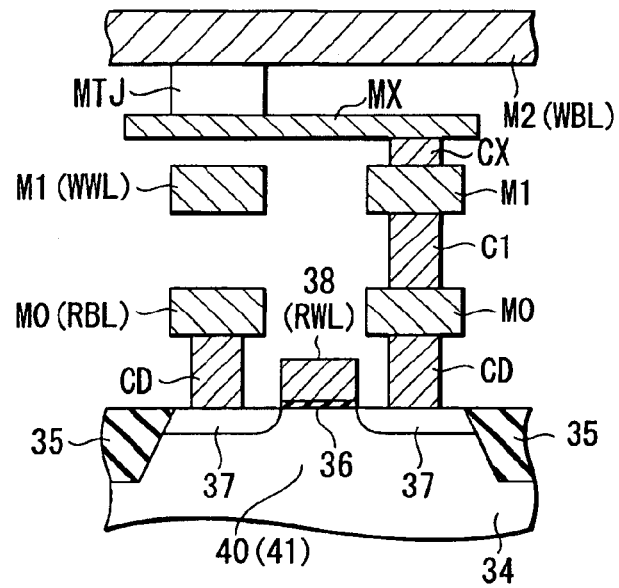
FIG. 10 is a schematic sectional view of the element structure of a part of the memory cell shown in FIG. 9.

FIG. 10 is a schematic sectional view of the element structure of a part of the 3Tr-2MTJ memory cell shown in FIG. 9. The cell select transfer gate 40 or 41 is formed in an active region divided by element isolating regions 35 formed in a semiconductor substrate 34.

Figure 11A:
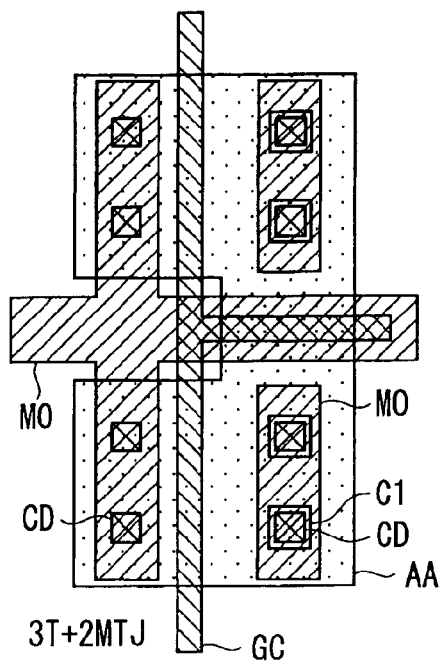
FIGS. 11A and 11B each show an example of a different plane layout of the memory cell shown in FIG. 9.
Figure 11B:
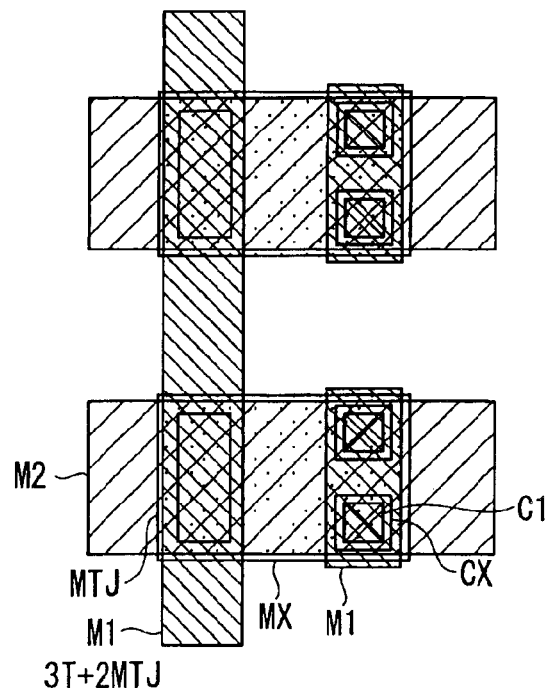

FIG. 11A shows a plane layout of contact C1 and the layer lower than contact C1 in FIG. 10. FIG. 11B shows a plane layout of contact C1 and the layer higher than contact C1 in FIG. 10. As shown in FIG. 11A, there is a recessed part in an active region AA in the place where the first interconnection layer M0 extends laterally between the two MTJ elements. Here, GC in FIG. 11A corresponds to the gate electrode 38 of the cell select transfer gate 40 or 38.

<Modification of Third Embodiment>

Figure 12:
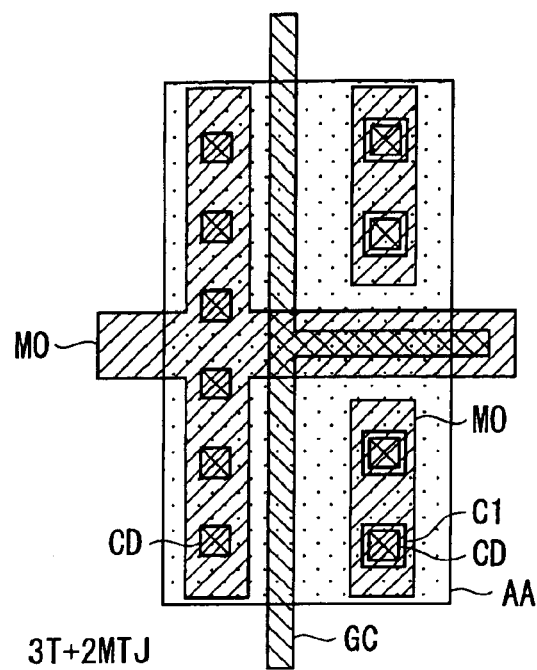
FIG. 12 shows another example of the plane layout shown in FIG. 11A.

FIG. 12 shows another example of the plane layout of the lower layer shown in FIG. 11A. The plane layout of FIG. 12 is the same as the plane layout of FIG. 11A except that an active region AA is provided continuously also in the place where the first interconnection layer M0 is extended laterally between the two MTJ elements.

It is expected that, as the pattern is miniaturized further, lithography will be more difficult to use in the recessed part in the active region AA of FIG. 11A. Therefore, it is safe to say that a layout pattern without such a recessed part is more suitable for miniaturization.

<Fourth Embodiment>

Figure 13:
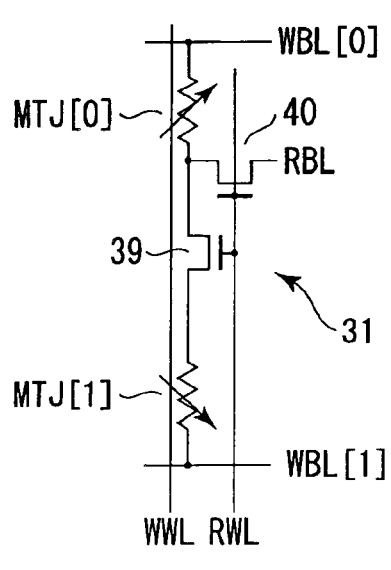
FIG. 13 is an equivalent circuit diagram of a magnetic memory cell in a memory cell array of an MRAM according to a fourth embodiment of the present invention.

FIG. 13 is an equivalent circuit diagram of a magnetic memory cell in a memory cell array of an MRAM according to a fourth embodiment of the present invention.

The magnetic memory cell of FIG. 13 differs from that of FIG. 9 in that the second read transfer gate 41 is eliminated. That is, the magnetic memory cell of FIG. 13 is a 2Tr-2MTJ magnetic memory cell.

In other words, in the 2Tr-2MTJ magnetic memory cell of FIG. 13, the cell select transfer gate 39 is inserted between the MTJ elements MTJ[0] and MTJ[1] in the 2MTJ magnetic memory cell of FIG. 4 and the junction node of one MTJ element MTJ[0], and one end of the transfer gate 39 is connected to the read bit line RBL via the read transfer gate 40. NMOSFETs are used as the transfer gates 39, 40. The gates of the transfer gates are connected to the read word line RWL.

While in the fourth embodiment, the transfer gate 40 is provided as the read transfer gate, the transfer gate 41 of FIG. 9 may be provided in place of the transfer gate 40.

The operation of the 2Tr-2MTJ magnetic memory cell in FIG. 13 is basically the same as that of the 2MTJ magnetic memory cell in FIG. 4 except that the on/off states of the two cell select transfer gates 39, 40 are controlled by a signal of the read word line RWL.

As described above, the transfer gate 39 is inserted between the MTJ elements MTJ[0] and MTJ[1] and the transfer gate 40 is provided between the magnetic memory cell and the read bit line RBL. This makes it possible to isolate the activated memory cells from the deactivated memory cells in the cell array so that circulating current via the read bit line RBL may be cut off, which realizes a reliable read operation.

Figure 14:
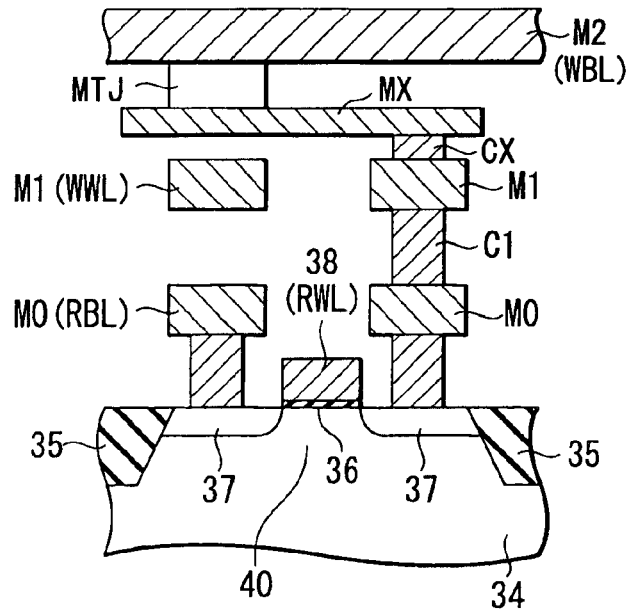
FIG. 14 is a schematic sectional view of the element structure of a part of the memory cell shown in FIG. 13.

FIG. 14 is a schematic sectional view of the element structure of a part of the 2Tr-2MTJ memory cell shown in FIG. 13. The cell select transfer gate 40 is formed in an active region divided by the element isolating regions 35 formed in the semiconductor substrate 34.

Figure 15A:
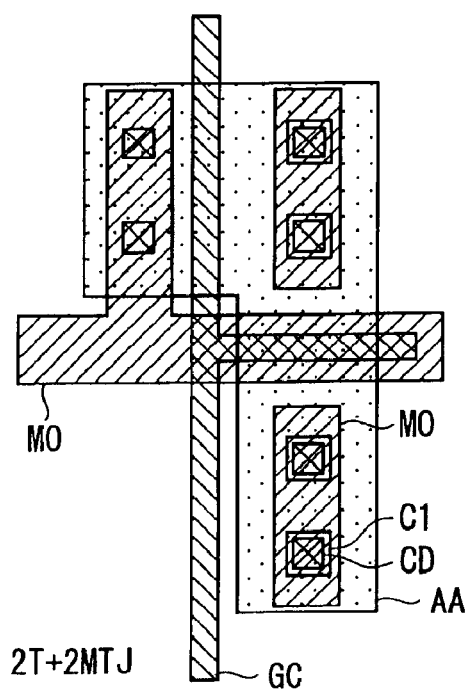
FIGS. 15A and 15B each show an example of a different plane layout of the memory cell shown in FIG. 13.
Figure 15B:
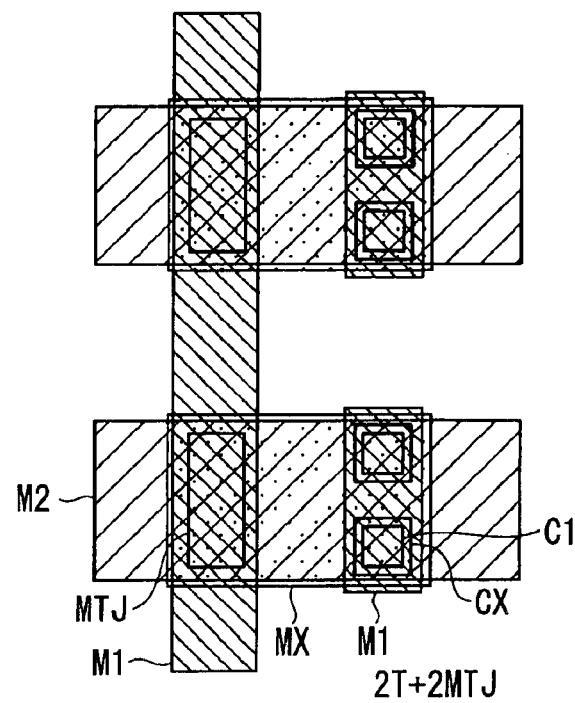

FIG. 15A shows a plane layout of contact C1 and the layer lower than contact C1 in FIG. 14. FIG. 15B shows a plane layout of contact C1 and the layer higher than contact C1 in FIG. 14. Here, GC in FIG. 15A corresponds to the gate electrode 38 of the cell select transfer gate 40. FIG. 15A shows a case where the read bit line RBL is arranged parallel to the write bit line WBL.

<Fifth Embodiment>

Figure 16:
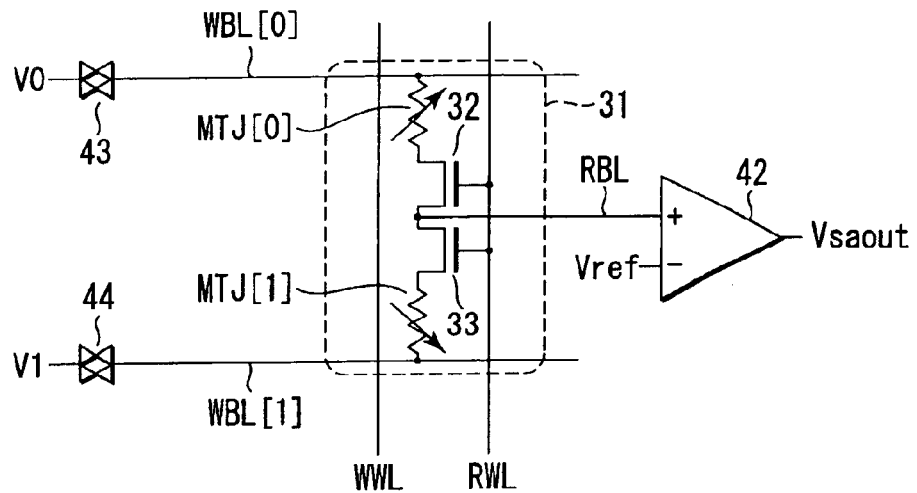
FIG. 16 is an equivalent circuit diagram showing a magnetic memory cell in a memory cell array of an MRAM and a read circuit according to a fifth embodiment of the present invention.

FIG. 16 is an equivalent circuit diagram showing a magnetic memory cell in a memory cell array of an MRAM and a read circuit according to a fifth embodiment of the present invention.

The MRAM of FIG. 16 differs from the MRAM of FIG. 5 in that a read circuit is added and that a transfer gate 43 is inserted between a node to apply a voltage V0 and the write bit line WBL[0] and a transfer gate 44 is inserted between a node to apply a voltage V1 and the write bit line WBL[1]. The read circuit includes a sense amplifier 42. The sense amplifier 42 compares the potential read onto the read bit line RBL with a reference potential Vref, thereby sensing data, and outputs signal Vsaout. Although the magnetic memory cell in FIG. 16 is of the 2Tr-2MTJ type cell to simplify the explanation, this embodiment is not restricted to this. For instance, the magnetic memory cell may be of the 3Tr-2MTJ type and of the other type.

The reference Vref supplied to the sense amplifier 42 is generated by a reference potential generator circuit. The value of the reference Vref is normally the middle potential between V0 and V1, that is, Vref=(V0+V1)/2.

In a read operation, the transfer gates 43, 44 are both turned on, with the result that the potential difference (V0−V1) is applied between both ends of the magnetic memory cell 31. Then, the read word line RWL is set to a potential higher than the sum of the average value of the V0 and V1 and the read potential by the threshold voltage Vth of the NMOSFET. As a result, the cell select transfer gates 32 and 33 in the magnetic memory cell 31 turn on, causing the signal read from the magnetic memory cell 31 to be transferred to the read bit line RBL and inputted to the sense amplifier 42. The sense amplifier 42 senses the potential of the read bit line RBL on the basis of the reference potential Vref.

In the fifth embodiment, in a read operation, a constant potential has only to be supplied to the write bit lines WBL[0], WBL[1]. Moreover, the reference potential Vref used in the sense amplifier 42 also has only to be the middle potential between V0 and V1 applied to the write bit lines WBL[0] and WBL[1], respectively.

Consequently, neither a constant voltage circuit including a feedback conduit nor the generation of a special reference potential is needed, which simplifies the circuit constituting the core section of the MRAM. Furthermore, the sense amplifier 42 can be realized by a latch circuit with a simple configuration, which enables the sense amplifier 42 to be laid out with the same pitch as the arrangement pitch of the magnetic memory cell 31. This makes it possible to realize, for example, burst reading.

<Sixth Embodiment>

Figure 17:
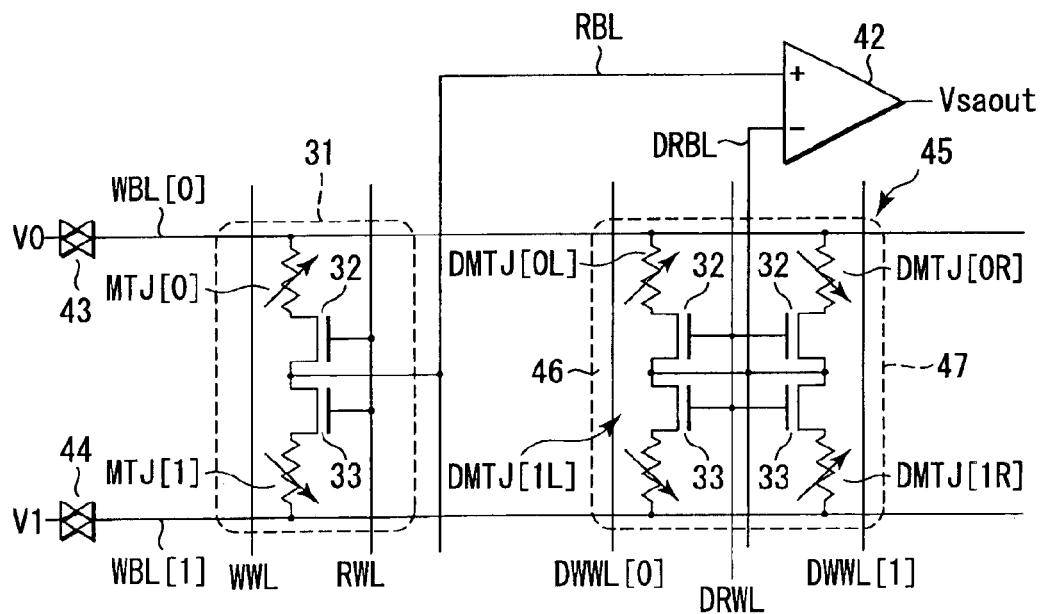
FIG. 17 is an equivalent circuit diagram showing a magnetic memory cell in a memory cell array of an MRAM and a read circuit according to a sixth embodiment of the present invention.

FIG. 17 is an equivalent circuit diagram showing a magnetic memory cell in a memory cell array of an MRAM and a read circuit according to a sixth embodiment of the present invention.

The MRAM of FIG. 17 differs from that of the second embodiment in that a circuit for generating a reference potential Vref supplied to the sense amplifier 42 is added.

In the sixth embodiment, the reference potential Vref is generated by a dummy magnetic memory cell 45. As described above, the reference potential Vref is the middle potential between V0 and V1, that is, (V0+V1)/2.

The dummy magnetic memory cell 45 is configured so as to generate the reference potential Vref by using dummy MJT elements similar to the MJT elements in the magnetic memory cell 31. The reference potential Vref generated at the dummy memory cell 45 is read onto a dummy read bit line DRBL and then supplied to the sense amplifier 42.

In FIG. 17, the aforementioned 2Tr-2MTJ type magnetic memory cells are used as the magnetic memory cell 31 and dummy magnetic memory cell 45 to simplify the explanation. This embodiment is not limited to this. For instance, the aforesaid 3Tr-2MTJ type magnetic memory cells and the other type cells may be used.

Next, a concrete example of the dummy magnetic memory cell 45 will be explained.

The dummy magnetic memory cell 45 is composed of a first and a second dummy cell 46, 47. The first dummy cell 46 is made up of two dummy MJT elements DMJT[0L] and DMTJ[1L] storing data items of opposite logic level and a dummy read transfer gates 32 and 33 corresponding to the read transfer gates 32 and 33. The second dummy cell 47 is made up of two dummy MJT elements DMJT[0R] and DMTJ[1R] storing data items of opposite logic level to each other and reverse to those in the first dummy cell 46 and a dummy read transfer gates 32 and 33 corresponding to the read transfer gates 32 and 33. In this case, the dummy MJT elements DMTJ[0L] and DMTJ[0R] are set so that the data in DMTJ[0L] may be opposite logic level to the data in DMTJ[0R]. The potentials read from the two dummy cells 46, 47 via the corresponding transfer gates 32 and 33 are combined on the dummy cell read word line DRWL, thereby generating the reference potential Vref. In FIG. 17, DWWL [0] and DWWL[1] are the write word lines for the dummy cells.

When the dummy cell read word line DRWL is activated in a read operation, the resultant reference potential expressed by $(V0-V1)/2$ appears on the dummy cell read bit line DRBL.

Next, a modification of the dummy magnetic memory cell 45 in FIG. 17 will be explained.

Figure 18:
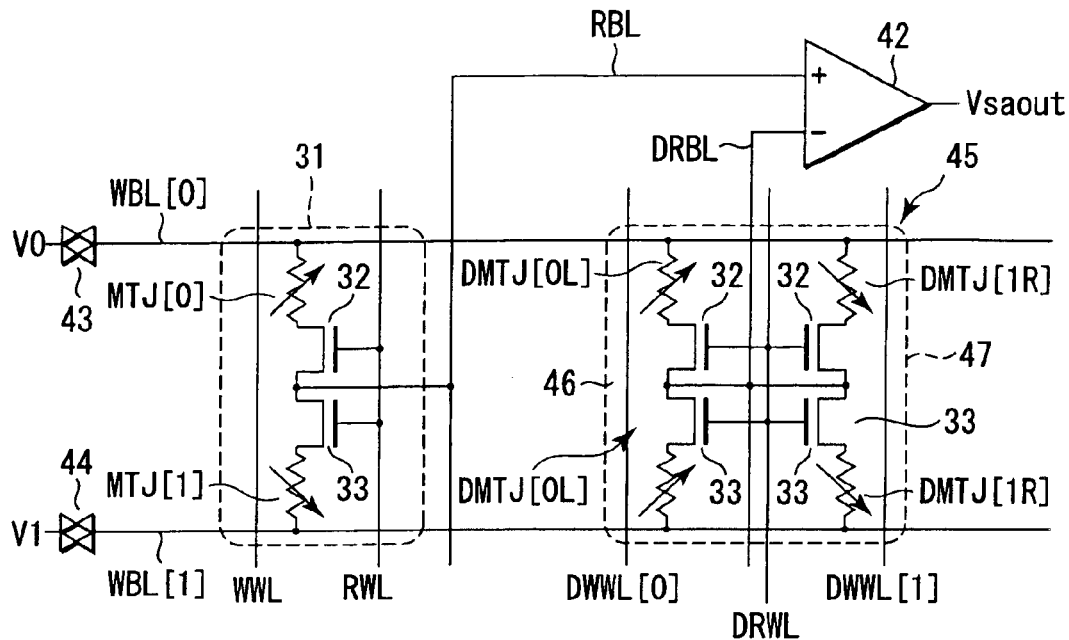
FIG. 18 is an equivalent circuit diagram showing a modification of the dummy magnetic memory cell in FIG. 17.

A dummy magnetic memory cell 45 shown in FIG. 18 is composed of a first and a second dummy cell 46, 47. The dummy magnetic memory cell of FIG. 18 differs from that of FIG. 17 in that the first dummy cell 46 includes two dummy MJT elements DMJT[0L] and DMJT[0L] each holding the same logic level data item and the second dummy cell 47 includes two dummy MJT elements DMJT[1R] and DMJT[1R] holding the same logic level data opposite logic level to the data in the first dummy cell 46. The potentials read from the first and second dummy cells 46, 47 via the corresponding dummy read transfer gates 32, 33 are combined on the dummy reading bit line DRBL, thereby generating a reference potential Vref.

When the dummy cell read word line DRWL is activated in a read operation, the reference potential expressed by $(V0-V1)/2$ is output onto the dummy cell read bit line DRBL.

While in the modification, a dummy cell has been provided in the same column as the memory cell to be read from, a dummy cell may be provided in a column different from the one including the memory cell to be read from.

In FIG. 18, the aforementioned 2Tr-2MTJ type magnetic memory cells are used as the magnetic memory cell 31 and dummy magnetic memory cell 45 to simplify the explanation. This embodiment is not limited to this. For instance, the aforesaid 3Tr-2MTJ type magnetic memory cells and the other type cells may be used.

<Seventh Embodiment>

Figure 19:
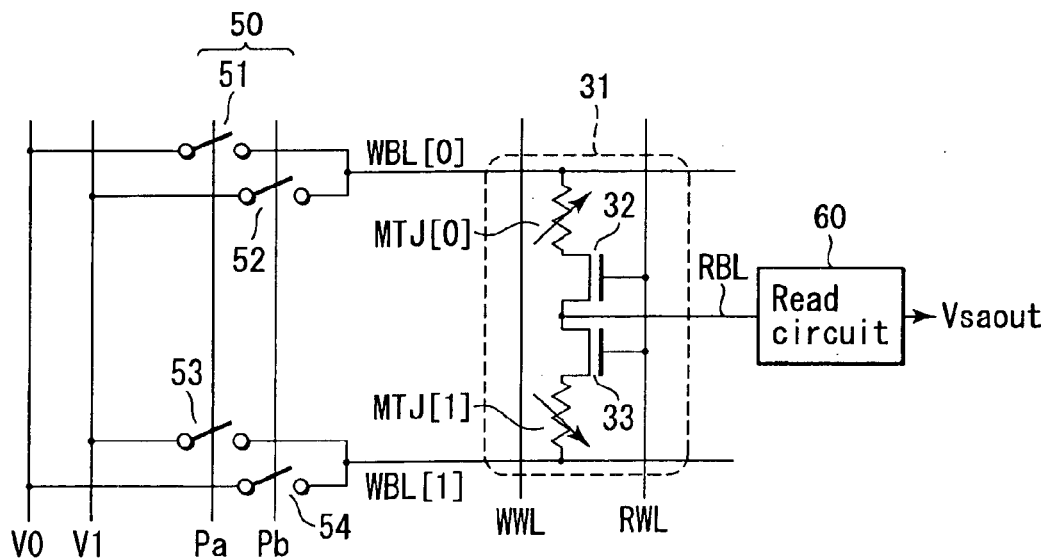
FIG. 19 is an equivalent circuit diagram showing a magnetic memory cell in a memory cell array of an MRAM according to an seventh embodiment of the present invention and a part of a read circuit.

FIG. 19 is an equivalent circuit diagram showing a magnetic memory cell in a memory cell array of an MRAM according to an seventh embodiment of the present invention and a part of a read circuit.

The MRAM of FIG. 19 differs from that of the second embodiment in that a switching circuit 50 is added which, when the data is read from the magnetic memory cell, applies a specific potential difference between the MTJ elements MTJ[0] and MTJ[1] in a first period and a potential difference the same in magnitude as but opposite in polarity to the specific potential difference between the MTJ elements MTJ[0] and MTJ[1] in a second period. Specifically, FIG. 19 shows a spurious self-reference read circuit which uses the potential read from the magnetic memory cell onto the read bit line RBL in the first period as the reference potential for the sense amplifier in the read circuit 60, senses data in the magnetic memory cell by comparing the potential read from the magnetic memory cell onto the read bit line RBL in the second period with the reference potential at the sense amplifier, and outputs signal Vsaout. In FIG. 19, the aforementioned 2Tr-2MTJ type magnetic memory cell is used as the magnetic memory cell 31 to simplify the explanation. This embodiment is not limited to this. For instance, the aforesaid 3Tr-2MTJ type magnetic memory cell and the other type cell may be used.

The switching circuit 50 includes, for example, a first-group switch element 51 inserted between a node with a voltage V0 and the write bit line WBL[0], a second-group switch element 52 inserted between a node with a voltage V1 and the WBL[0], a first-group switch element 53 inserted between a node with the voltage V1 and the write bit line WBL[1], and a second-group switch element 54 inserted between a node with the voltage V0 and the write bit line WBL[1]. The two switch elements 51, 53 in the first group are switched on by a signal of a first switch control line Pa activated in a first period. The two switch elements 52, 54 in the second group are switched on by a signal of a second switch control line Pb activated in a second period.

In the MRAM of the seventh embodiment, the data is read from the selected magnetic memory cell 31 by switching the potential difference applied between the write bit lines WBL[0] and WBL[1] between a first read operation and a second read operation.

That is, in the first read operation, the first switch control line Pa is activated, thereby turning on the two switch elements 51, 53 in the first group. This causes such a potential difference as sets the potential of one write bit line WBL[0] to V0 and the potential of the other write bit line WBL[1] to V1 to be applied between both ends of the magnetic memory cell 31. If data "1" is stored in the magnetic memory cell 31, the potential output on the read bit line RBL is expressed as:

$$Vi_{sg}[a]=\{(1+MR)/(2+MR)\}\times(V0-V1) \quad (6)$$

In the second read operation, the second switch control line Pb is activated, thereby turning on the two switch elements 52, 54 in the second group. As a result, the potential of one write bit line WBL[0] is set to V1 and the potential of the other write bit line WBL[1] is set to V0, which is opposite to the first reading. At this time, the potential output on the read bit line RBL is expressed as:

$$Vi_{sg}[b]=\{1/(2+MR)\}\times(V0-V1) \quad (7)$$

Here, from the difference between equation (6) and equation (7), the signal (potential difference) Vdiff input to the sense amplifier is expressed as:

$$Vdiff=\{(MR/(2+MR))\}\times(V0-V1) \quad (8)$$

In contrast, in the first embodiment, from the difference between equation (3) and equation (5) or between equation (4) and equation (5), the signal (potential difference) Vdiff input to the sense amplifier is expressed as:

$$Vdiff=\{(MR/2)/(2+MR)\}\times(V0-V1) \quad (9)$$

The comparison between equation (8) and equation (9) has shown that the amount of read signal can be doubled in a spurious self-reference method as shown in the seventh embodiment. This produces the effects of achieving a higher-speed sensing operation, improving the immunity to variations in the characteristics of MTJ elements, and others.

Since the spurious self-reference read circuit does not require the operation of writing data into the magnetic memory cell, the sensitivity does not deteriorate because of power noise caused by a write operation as compared with a conventional self-reference read circuit.

<Eighth Embodiment>

Figure 20:
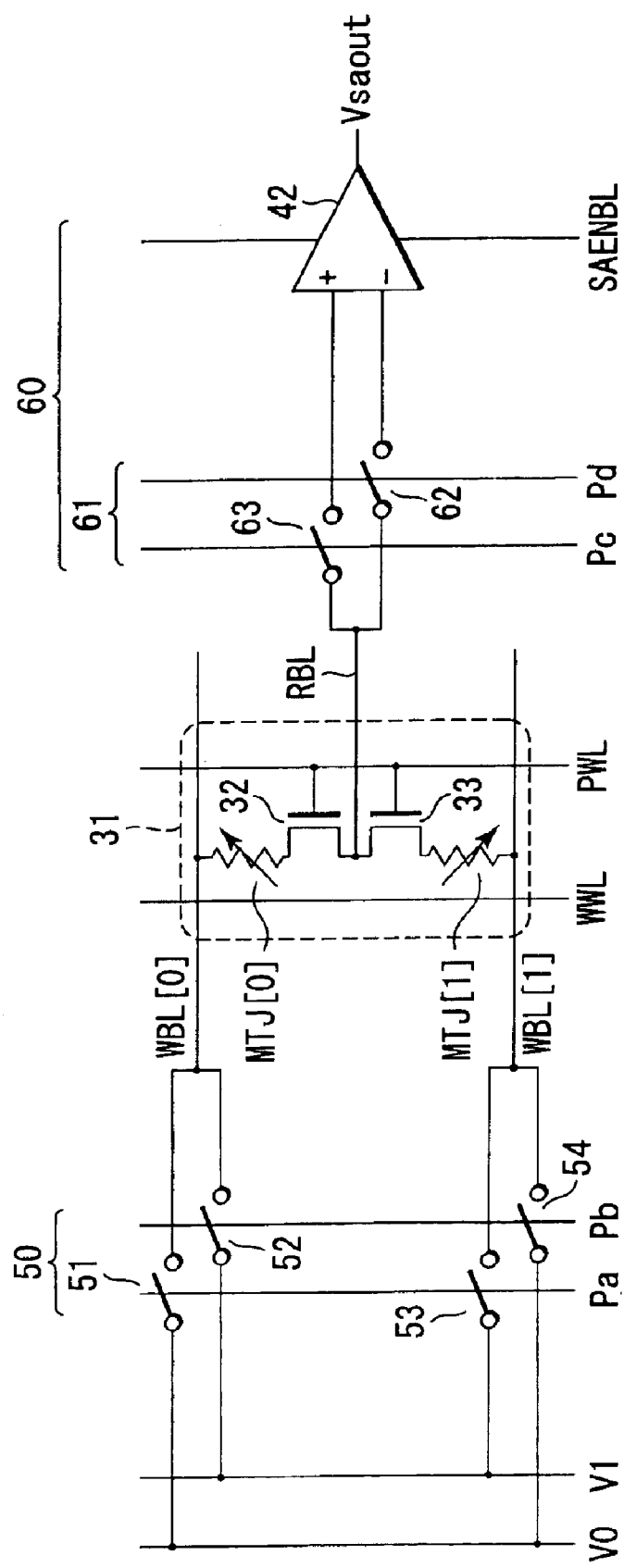
FIG. 20 is an equivalent circuit diagram showing a magnetic memory cell and a part of the read circuit according to an eighth embodiment of the present invention.

FIG. 20 is an equivalent circuit diagram showing a magnetic memory cell and a part of the read circuit which embody the read circuit 60 of FIG. 18.

A second switching circuit 61 for switching the output of the potential read from the magnetic memory cell 31 onto the read bit line RBL between the first period and the second period is added to the read circuit 60. In the first period, the sense amplifier 42 causes the input capacitance of a first input terminal (−) to hold the potential read onto the read bit line RBL at the reference potential Vref. In the second period, the sense amplifier 42 causes the input capacitance of a second input terminal (+) to hold the potential read onto the read bit line RBL. Thereafter, the sense amplifier 42 compares the potential with the reference potential Vref to sense the data and outputs signal Vsaout. Here, SAENBL is an active signal to the sense amplifier 42. In FIG. 20, the aforementioned 2Tr-2MTJ type magnetic memory cell is used as the magnetic memory cell 31 to simplify the explanation. This embodiment is not limited to this. For instance, the aforesaid 3Tr-2MTJ type magnetic memory cell and the other type cell may be used.

The second switching circuit 61 includes, for example, a switch element 62 inserted between the read bit line RBL and the first input terminal (−) of the sense amplifier 42 and a switch element 63 inserted between the read bit line RBL and the second input terminal (+) of the sense amplifier 42. The switch element 62 is switched on by a signal of the switch control line Pd activated in the first period. The switch element 63 is switched on by a signal of the switch control line Pc activated in the second period.

In the MRAM of the eighth embodiment, the data is read from the selected magnetic memory cell by switching the potential applied between the write bit lines WBL[0] and WBL[1] between a first read operation and a second read operation. In the first read operation, the switch control line Pd is activated, causing the signal output onto the read bit line RBL to be transferred to the first input terminal (−) of the sense amplifier 42 via the switch element 62. Thereafter, the switch control line Pd is deactivated. In the second read operation, the switch control line Pc is activated, causing the signal output onto the read bit line RBL to be transferred to the second input terminal (+) of the sense amplifier 42 via the switch element 63. Then, the switch control line Pc is deactivated. Thereafter, the enable signal SAENBL is activated, starting the sense amplifier 42, which outputs signal Vsaout, the result of the sensing.

In the eighth embodiment, from the equation (6) and the equation (7), the difference between the signals input to the first and second input terminals are expressed as:

$$Vsig[a] - Vsig[b] = \{MR/(2+MR)\} \times (V0-V1) \quad (10)$$

That is, two read operations produce the amount of read signal twice that in the first embodiment.

<Ninth Embodiment>

Figure 21:
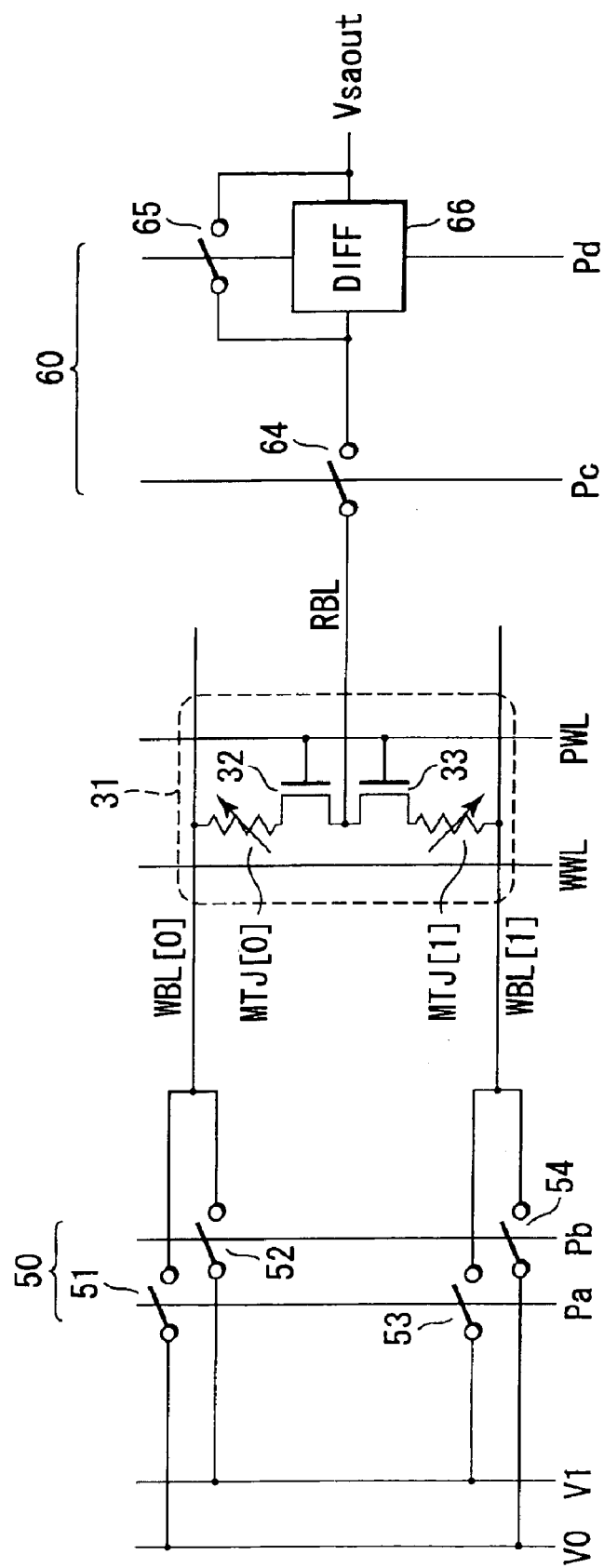
FIG. 21 is a circuit diagram showing another configuration of the read circuit according to a ninth embodiment of the present invention.

FIG. 21 is a circuit diagram showing another configuration of the read circuit 60 shown in FIG. 19.

The read circuit 60 of FIG. 21 is composed of two switch circuits 64, 65 and a differentiator 66. One switch circuit 64 is inserted between the read bit line RBL and the input node of the differentiator 66. The switch element 64 is switched by a signal of the switch control line Pc. The other switch element 65 is inserted between the input and output nodes of the differentiator 66. The switch element 65 is switched by a signal of the switch control line Pd. In FIG. 21, the aforementioned 1Tr-2MTJ type magnetic memory cell is used as the magnetic memory cell 31 to simplify the explanation. This embodiment is not limited to this. For instance, the aforesaid 3Tr-2MTJ type magnetic memory cell and the other type cell may be used.

In the MRAM of the ninth embodiment, when the data is read from the selected magnetic memory cell 31, the first switching circuit 50 switches the potential applied between the write bit lines WBL[0] and WBL[1] between a first read operation and a second read operation.

In the first read operation, the switch control lines Pc and Pd are activated, turning on the switch elements 64 and 65. This causes the signal read onto the read bit line RBL to be transferred to the output node of the differentiator 66 via the switch elements 64 and 65. Thereafter, the switch control line Pc is deactivated. With the switch element 64 in the on state, the switch control line Pd is activated, the switch element 65 is on, and the output and input nodes of the differentiator 66 are short-circuited. At this time, the potential of the input node of the differentiator 66 is set to the reference potential Vref.

In the second read operation, after the signal has been read onto the read bit line RBL, the switch control line Pd is deactivated, turning off the switch element 65, which separates the input node of the differentiator 66 from its output node electrically. Thereafter, the switch control line Pc is activated, turning on the switch element 64, which causes the signal read onto the read bit line RBL to be transferred to the input node of the differentiator 66 via the switch element 64. At this time, the differentiator 66 senses a change in the potential of the input node, thereby sensing data in the magnetic memory cell 31. The result of the sensing is output as the signal Vsaout.

In the MRAM of the ninth embodiment, the read circuit 60 carries out a sense operation on the basis of only the relative relationship between the resistances of the MTJ elements MTJ[0] and MTJ[1], without depending on the absolute values of the resistances of the MTJ elements. Consequently, even when the resistances of the MTJ elements vary from one memory chip to another, a reliable sensing operation can be realized.

<Tenth Embodiment>

FIG. 22 is a circuit diagram showing a part of a memory cell array of an MRAM according to a tenth embodiment of the present invention and a part of its peripheral circuit.

In the MRAM of FIG. 22, a plurality of magnetic memory cells 31 shown in one of the first to fourth embodiments are arranged in a matrix, thereby forming a memory cell array. A plurality of read word lines RWLs are arranged in the row direction of the memory cell array and a plurality of read bit lines RBLs are arranged in the column direction. Each of the plurality of read word lines RWLs is connected to a plurality of magnetic memory cells 31 in each row. Each of the plurality of read bit lines RBLs is connected to a plurality of magnetic memory cells 31 in each column. A sense amplifier 42 is connected to the read bit line RBL for each column in the memory cell array. The read bit line RBL is arranged parallel to the write word line WBL.

In FIG. 22, the aforementioned 2Tr-2MTJ type magnetic memory cell is used as the magnetic memory cell 31 to simplify the explanation. This embodiment is not limited to this. For instance, the aforesaid 3Tr-2MTJ type magnetic memory cell and the other type cell may be used.

A word line driver 71 is provided for each row in the memory cell array. The output of each word line driver 71 is connected to the corresponding read word line RWL. The reference potential Vref used in the sense amplifier 42 is generated by a reference potential generator circuit.

A bit line driver 72 is provided for each column in the memory cell array. The bit line driver 72 supplies a potential difference between a pair of write bit lines WBL[0], WBL[1] in each column in a read operation. Each bit line driver 72 has a first read potential supplying source for supplying a first potential to one of the write bit line WBL pair and a second read potential supplying source for supplying a second potential to the other of the write bit line WBL pair. The two read potential supplying sources are provided at one end of the pair of write bit lines WBLs in the same direction. In the eleventh embodiment, the read potential supplying PMOSFET 73 and NMOSFET 74 are connected to the pair of write bit lines WBLs.

In the tenth embodiment, one word line driver 71 activates read word lines RWL of one row. All of the bit line drivers 72 connected to the memory cell array are activated, thereby causing data of one row to be read into all of the sense amplifiers connected to the memory cell array.

In addition, since the two read potential supply sources connected to a pair of write bit lines WBL are both connected to the write bit lines WBL, the wiring resistance of the write bit line WBL[0] between the read potential supply source and the selected memory cell is equal to that of the write bit line WBL[1], with WBL[0] and WBL[1] forming a pair. This prevents the read margin from decreasing due to the wiring resistance of the write bit lines WBL.

Next, a method of precharging the write and read bit lines WBL, RBL in reading data from the magnetic memory cell in the eleventh embodiment will be explained. Basically, a method of precharging the write and read bit lines WBL, RBL to (a) a potential Vaa, a method of precharging the write and read bit lines WBL, RBL to (b) a potential Vb1=(Vaa+Vss)/2, and a method of precharging the write and read bit lines WBL, RBL to (c) a potential Vss may be used. Here, Vaa and Vss represent two potentials set on the write bit lines WBL in a read operation and correspond to the potentials V0 and V1 explained earlier.

FIG. 23A shows an example of the waveform of the potential in a read operation when using a method of precharging the write bit lines WBLs (WBL[0], WBL[1]) to the first potential Vaa in a period before the read operation.

FIG. 23B shows an example of the waveform of the potential in a read operation when using a method of precharging the write bit lines WBLs (WBL[0], WBL[1]) to the middle potential between the first potential Vaa and the second potential Vss, that is, Vb1=(Vaa+Vss)/2, in a period before the read operation.

FIG. 23C shows an example of the waveform of the potential in a read operation when using a method of precharging the write bit lines WBLs (WBL[0], WBL[1]) to the second potential Vss in a period before the read operation.

In FIGS. 24A, 24B, and 24C, READ indicates a waveform of the potential of the read drive signal and SN indicates a waveform of the potential at the signal read node between the two MTJ elements included in a memory cell. The solid lines represent potential waveforms in reading "0" data and the broken lines represent potential waveforms in reading "1" data.

FIG. 24A shows an example of the waveform of the potential in a read operation when using a method of precharging the read bit line RBL to the first potential Vaa in a period before the read operation.

FIG. 24B shows an example of the waveform of the potential in a read operation when using a method of precharging the read bit line RBL to the middle potential between the first potential Vaa and the second potential Vss, that is, Vb1=(Vaa+Vss)/2, in a period before the read operation.

FIG. 24C shows an example of the waveform of the potential in a read operation when using a method of precharging the read bit line RBL to the second potential Vss in a period before the read operation.

In FIGS. 24A, 24B, and 24C, RWL indicates a waveform of the potential on the read word line. When the read word line RWL is activated, the potential of RWL becomes equal to or higher than the first potential Vaa.

In the method of precharging the bit lines WBL, RBL to the potential Vaa, since NMOSFET generally has a higher current driving capability than PMOSFET, the time required to change the potential of the bit line from Vaa to Vss in a read operation becomes shorter, which helps realize a higher-speed read operation.

In the method of precharging the bit lines WBL, RBL to the potential Vb1, since the potential amplitude of the bit line is as small as Vaa−Vb1 or Vb1−Vss in a read operation, a read operation can be carried out with a small drawn current.

In the method of precharging the bit lines WBL, RBL to the potential Vss, since no potential may be supplied in periods other than a read operation or in a standby period, a low power consumption is realized. Furthermore, when the mode is changed from the standby mode to the active mode or when the mode goes into a read operation, there is no need to precharge the potential of the bit line. This shortens the time required for the transition from one mode to another, which realizes a higher-speed operation and a lower power consumption.

<Eleventh Embodiment>

Figure 25:
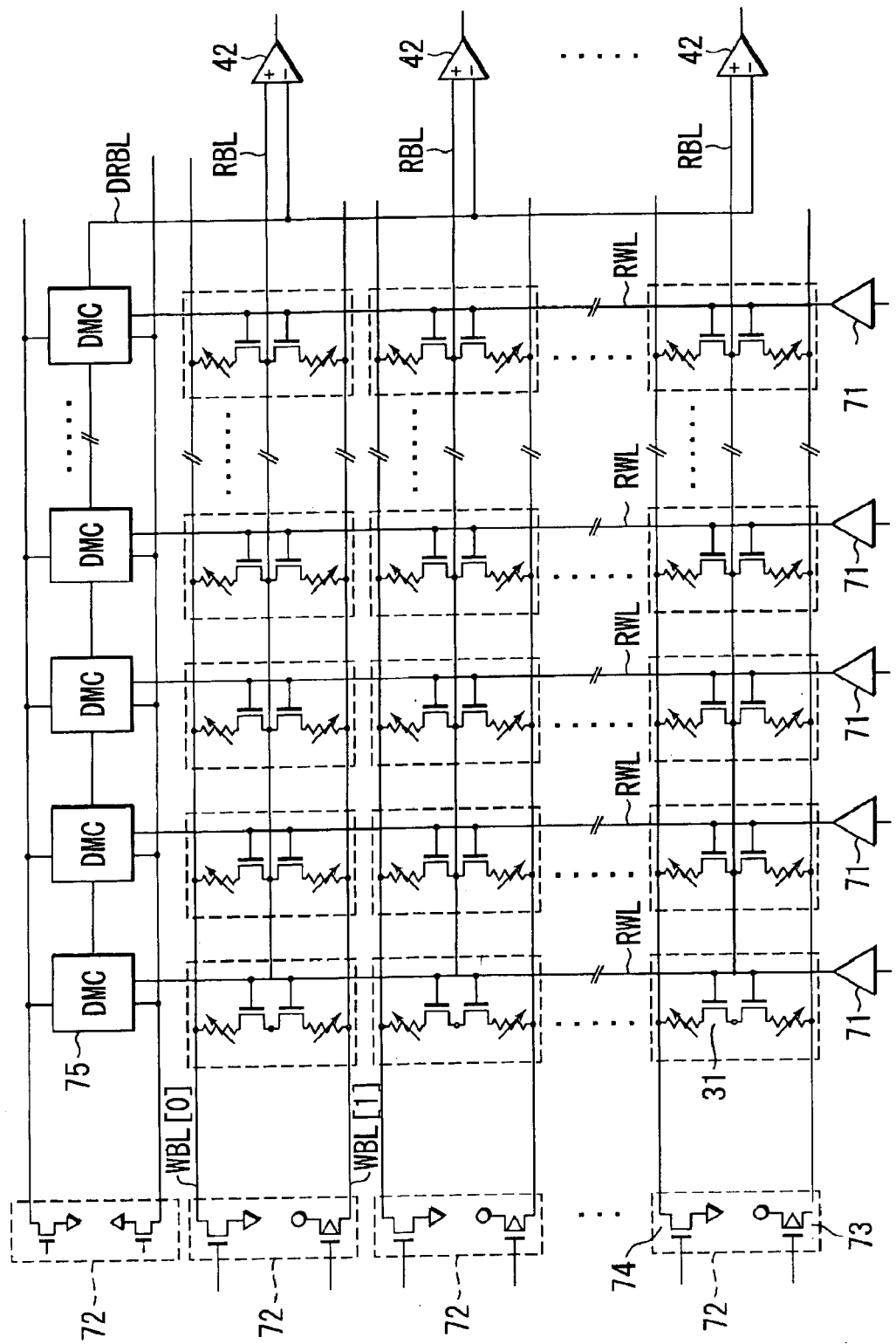
FIG. 25 is a circuit diagram showing a part of the memory cell array in an MRAM according to a eleventh embodiment of the prevent invention and a part of a peripheral circuit.

FIG. 25 is a circuit diagram showing a part of a memory cell array of an MRAM according to an eleventh embodiment of the present invention and a part of its peripheral circuit.

In the MRAM of FIG. 25, at least one column of dummy magnetic memory cells (DMC) 75 for generating the reference potential Vref is arranged in a memory cell array where a plurality of magnetic memory cells 31 shown in one of the first to fourth embodiments have been arranged in a matrix. The read word line RWL is connected to the magnetic memory cells 31 and a dummy magnetic memory cell 75 in each row of the memory cell array. The read word line RWL is connected equally to the magnetic memory cells 31 in each column of the cell array. The read word lines RWL are arranged in the row direction and the read bit lines RBLs are arranged in the column direction. A dummy read bit line DRBL is connected to a column of dummy magnetic memory cells 75. The dummy read bit lines DRBLs are arranged in the column direction. A sense amplifier 42 is connected to a read bit line RBL in such a manner that the amplifier corresponds to each column in the memory cell array. The read bit line RBL is arranged parallel to the write bit line WBL. In FIG. 25, the aforementioned 2Tr-2MTJ type magnetic memory cell is used as the magnetic memory cell 31 to simplify the explanation. This embodiment is not limited to this. For instance, the aforesaid 3Tr-2MTJ type magnetic memory cell and the other type cell may be used.

A word line driver 71 is provided for each row in the memory cell array. The outputs of the word line drivers 71 are connected to the corresponding read word lines RWLs. A bit line driver 72 provided for each column also serves as a read driver. The bit line driver 72 is composed of a PMOSFET 73 and an NMOSFET 74. A sense amplifier 42 is provided for each column. The potential read onto the read bit line RBL for the corresponding column and the reference potential Vref output onto the dummy read bit line DRBL are supplied to the sense amplifier 42.

In the eleventh embodiment, the memory cell 31 to be read from and the dummy cell 75 are activated by the same read word line RWL. Therefore, the wiring resistance of the bit line WBL between the bit line driver 72 and the memory cell 31 is equal to the wiring resistance of the bit line WBL between the bit line driver 72 and the dummy cell 75, which makes the effect of the resistance of the bit line WBL on the memory cell 31 equal to that on the dummy cell 75. This prevents the sense margin in the sense amplifier from decreasing.

In the eleventh embodiment, too, the method of precharging the write and read bit lines WBLs and RBLs in a read operation can be carried out as described above.

<Twelfth Embodiment>

Figure 26:
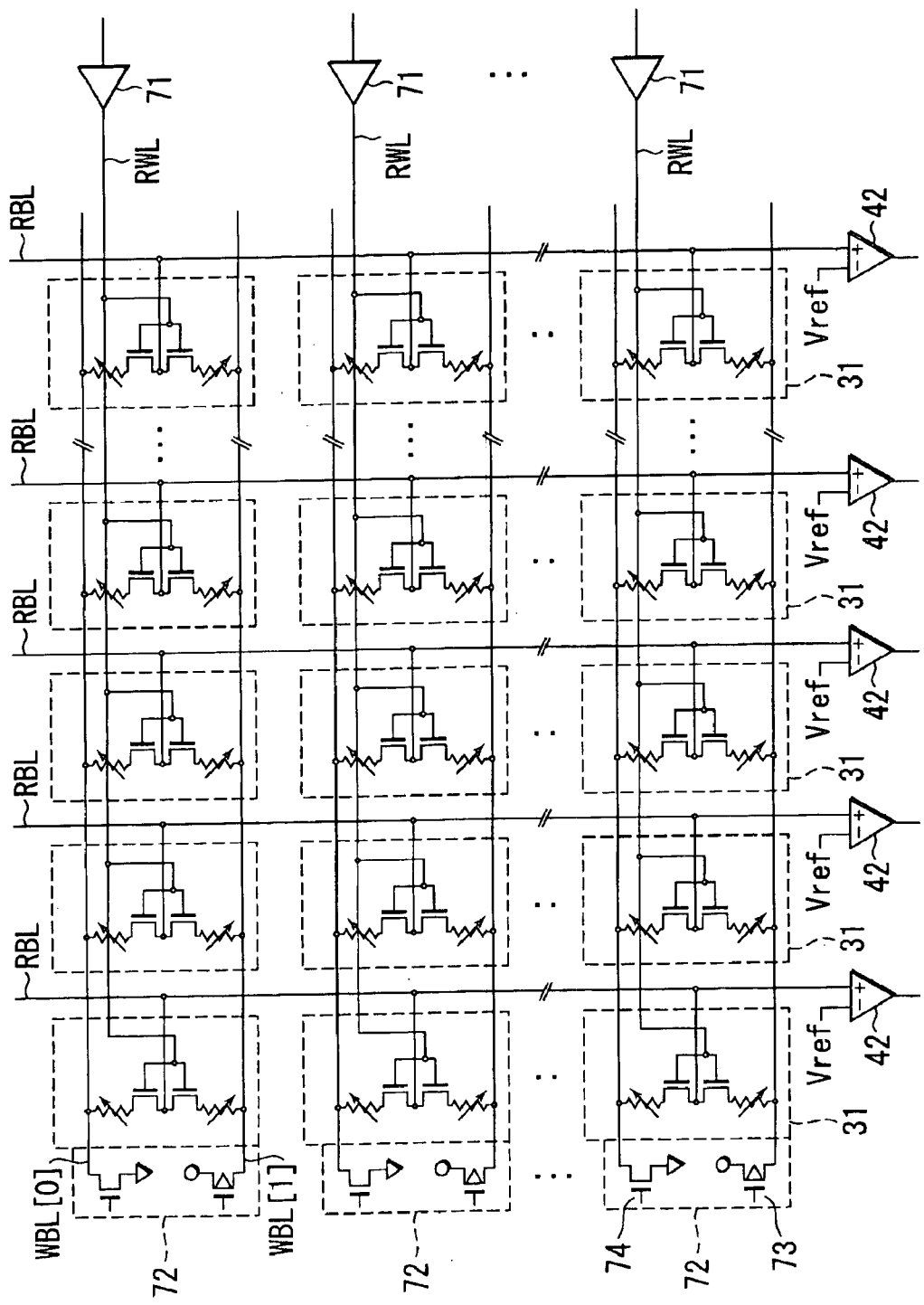
FIG. 26 is a circuit diagram showing a part of the memory cell array in an MRAM according to a twelfth embodiment of the prevent invention and a part of a peripheral circuit.

FIG. 26 is a circuit diagram showing a part of a memory cell array of an MRAM according to a twelfth embodiment of the present invention and a part of its peripheral circuit.

In the MRAM of FIG. 26, a plurality of magnetic memory cells 31 shown in one of the first to fourth embodiments are arranged in a matrix, thereby forming a memory cell array. A read word line RWL is connected to the magnetic memory cells 31 in each column of the memory cell array. A read bit line RBL is connected to the magnetic memory cells 31 in each row of the memory cell array. The read word lines RWLs are arranged in the column direction and the read bit lines RBLs are arranged in the row direction. A sense amplifier 42 is provided in such a manner that each amplifier corresponds to each row in the memory array. The read bit line RBL for each row is connected to the corresponding sense amplifier 42. The read bit line RBL is provided in a direction perpendicular to the write bit line WBL.

In the twelfth embodiment, just by activating the bit line driver 72 corresponding to a pair of write bit lines WBLs and the word line driver 71 corresponding to a column of read word lines RWLs, data in all the magnetic memory cells 31 connected to the column can be read.

In the twelfth embodiment, too, the method of precharging the write and read bit lines WBLs and RBLs in a read operation can be carried out as described above.

The MRAM according to the first to twelfth embodiments of the invention may be applied in various examples. Some of the applicable examples are explained below.

APPLICABLE EXAMPLE 1

Figure 27:
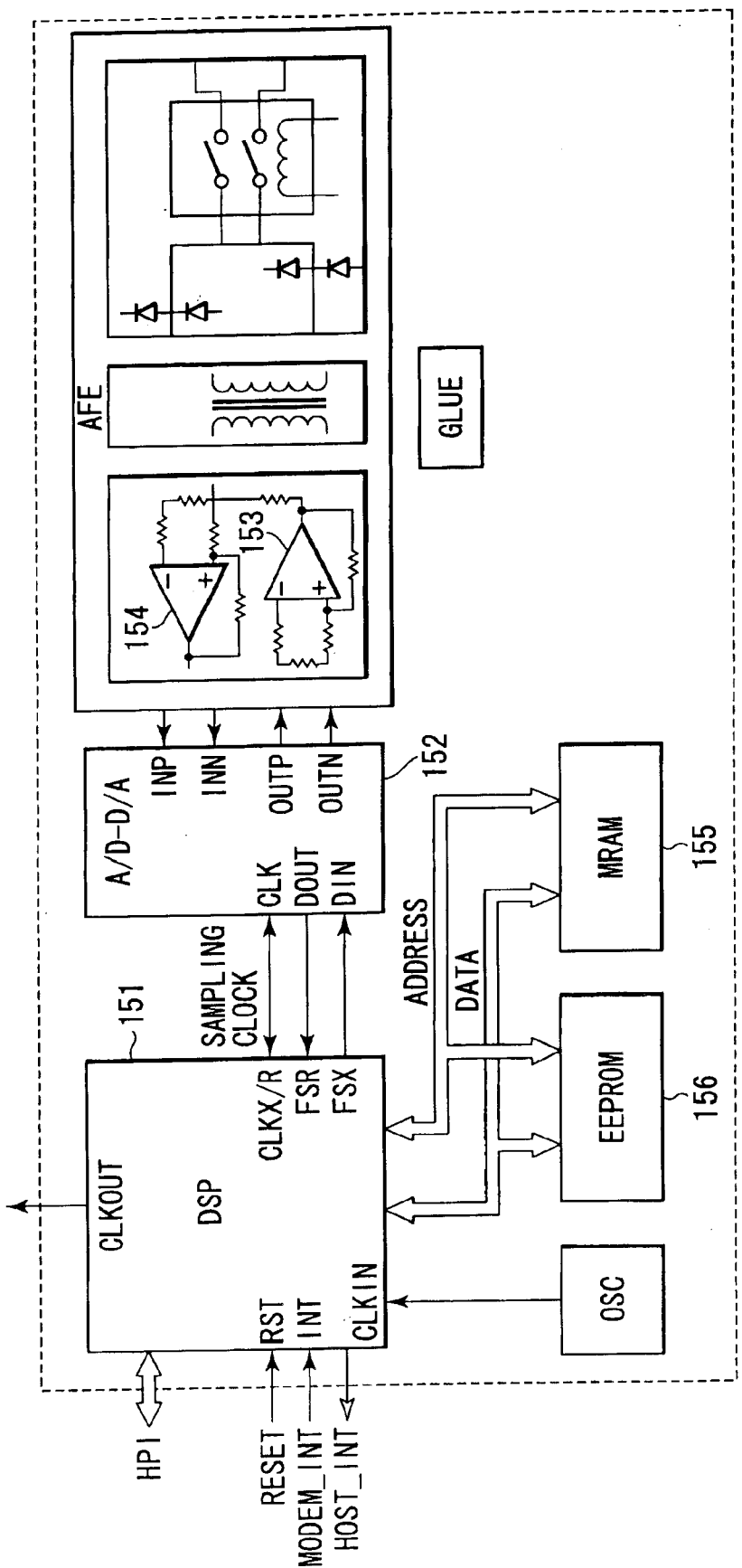
FIG. 27 is a block diagram of a DSL data path portion of a digital subscriber line as one of application examples of MRAM.

As one of applicable examples of the MRAM, FIG. 27 shows a digital subscriber line (DSL) data path portion of a digital subscriber line (DSL) modem. This modem includes a programmable digital signal processor (DSP) 151, an analog-to-digital converter (ADC) and digital-to-analog converter (DAC) 152, a transmission driver 153, and a receiver amplifier 154. In FIG. 27, the band pass filter is omitted, and an MRAM 155 and an EEPROM 156 are shown instead as an optional memory of various types capable of holding a line code program.

In this example, as the memory for holding the line code program, two memories MRAM and EEPROM are used, but the EEPROM may be replaced by the MRAM, that is, without using two memories, only the MRAM may be used.

APPLICABLE EXAMPLE 2

Figure 28:
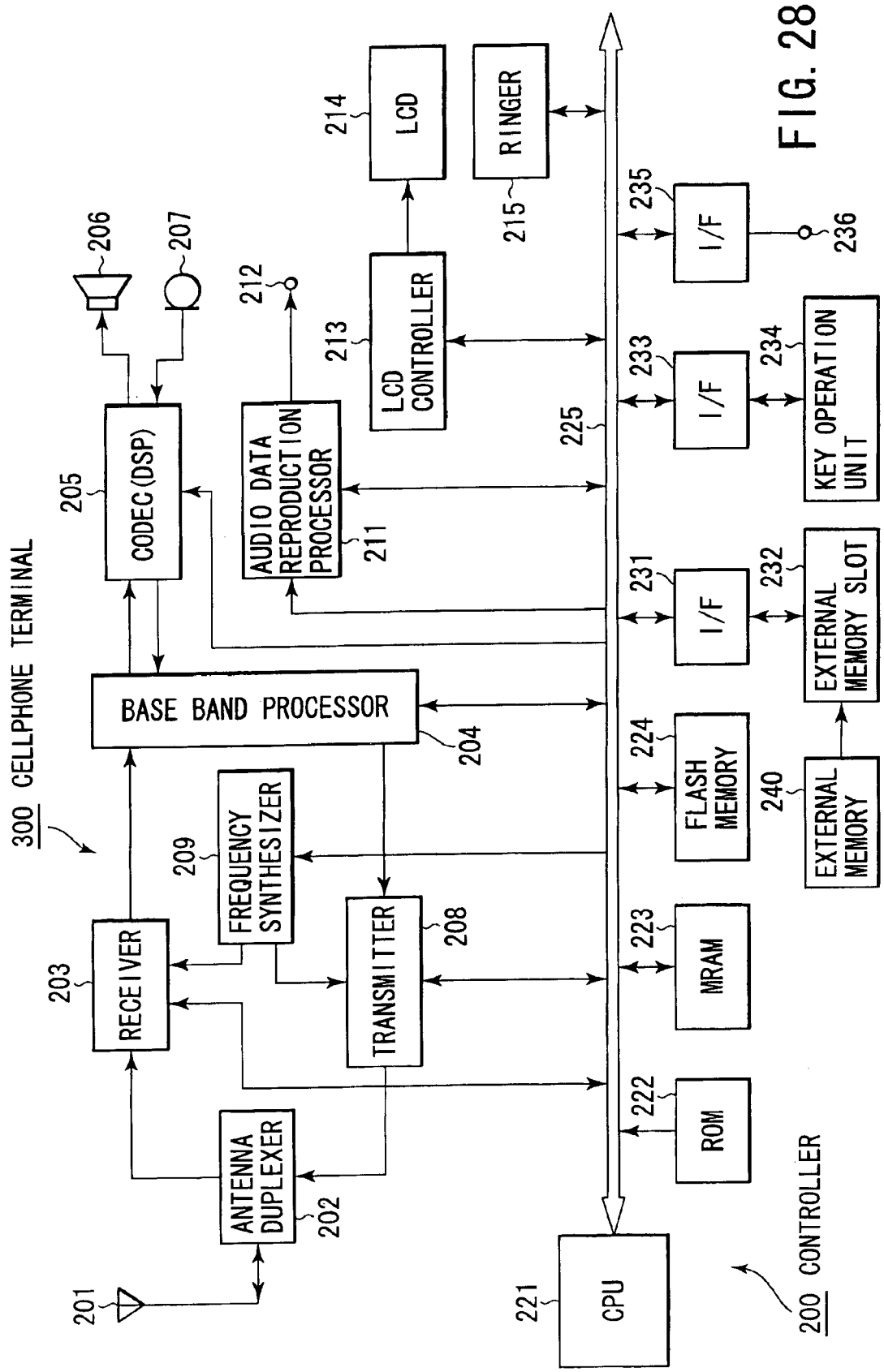
FIG. 28 is a block circuit diagram of a circuit portion for realizing communication function in a cellphone terminal as another application examples of MRAM.

As another applicable example of the MRAM, FIG. 28 shows a portion for realizing communication function in a cellphone terminal 300. As shown in FIG. 28, the portion for realizing the communication function comprises a transmission and reception antenna 201, an antenna duplexer 202, a receiver 203, a base band processor 204, a digital signal processor (DSP) 205 used as audio codec, a loudspeaker 206, a microphone 207, a transmitter 208, and a frequency synthesizer 209.

Also as shown in FIG. 28, the cellphone terminal 300 has a controller 200 for controlling the parts of the cellphone terminal. The controller 200 is a microcomputer composed by connecting a CPU 221, a ROM 222, an MRAM 223, and a flash memory 224 by way of a CPU bus 225.

Herein, the ROM 222 preliminarily stores programs to be executed in the CPU 221, and necessary data such as display font. The MRAM 223 is mainly used as a working region, and specifically it is used when storing necessary data in the midst of calculation as required during program execution by the CPU 221, or when temporarily storing data to be used in communications between the controller 200 and other parts. The flash memory 224 stores the immediate preceding setting conditions or the like even if the power source of the cellphone terminal 300 is turned off, or stores the setting parameters when using by setting in the same conditions when the power source is turned on again. That is, the flash memory 224 is a nonvolatile memory holding the stored data even if the power source of the cellphone terminal is turned off.

In this example, the ROM 222, MRAM 223, and flash memory 224 are used, but the flash memory 224 may be replaced by the MRAM, or the ROM 222 may be also replaced by the MRAM.

In FIG. 28, reference numeral 211 is an audio data reproduction processor, 212 is an external terminal connected to the audio data reproduction processor 211, 213 is an LCD controller, 214 is an LCD connected to the LCD controller 213, 215 is a ringer, 231 is an interface provided between a CPU bus 225 and an external memory slot 232, 233 is an interface provided between the CPU bus 225 and a key operation unit 234, 235 is an interface provided between the CPU bus 225 and an external terminal 236, and an external memory 240 is inserted into the external memory slot 232.

APPLICABLE EXAMPLE 3

FIGS. 29 to 33 show an example in which the MRAM according to the present invention is applied to a card (MRAM card) that embodies a removable media such as a Smart Media card.

Figure 29:
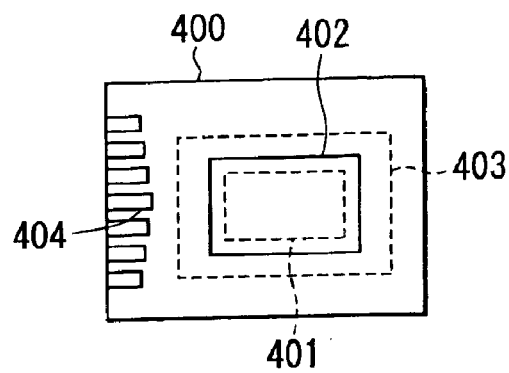
FIG. 29 is a top view showing an example in which the MRAM is applied to an MRAM card.

In a top view in FIG. 29, reference numeral 400 is an MRAM card main body, 401 is an MRAM chip, 402 is an opening, 403 is a shutter, and 404 denotes plural external terminals. The MRAM chip 401 is contained in the MRAM card main body 400, and is exposed to outside through the opening 402. While carrying the MRAM card, the MRAM chip 401 is covered with the shutter 403. The shutter 403 is made of a material having an effect of shielding an external magnetic field, such as ceramic material. When transferring the data, the shutter 403 is released, and the MRAM chip 401 is exposed. The external terminals 404 are for taking out the contents data stored in the MRAM card to outside.

Figure 30:
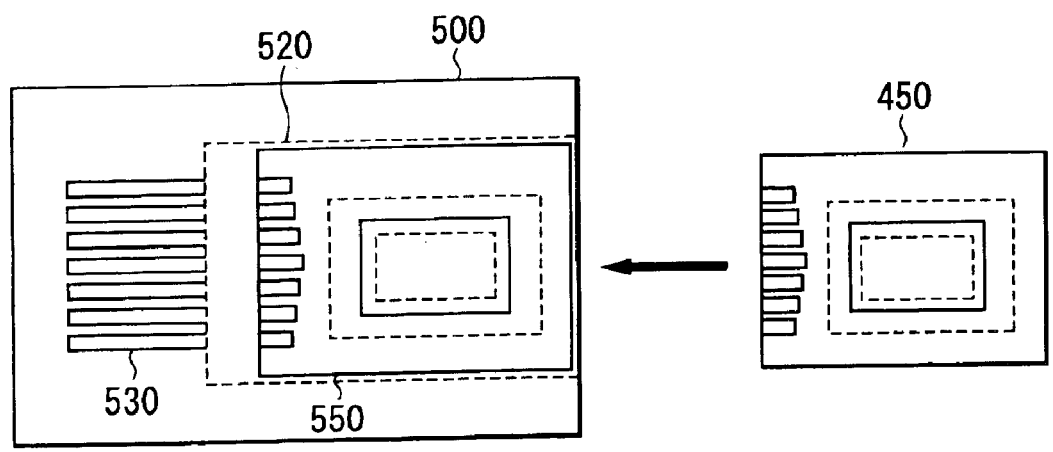
FIG. 30 is a top view of a transfer device of card insert type for transferring data on the MRAM card in FIG. 29.
Figure 31:
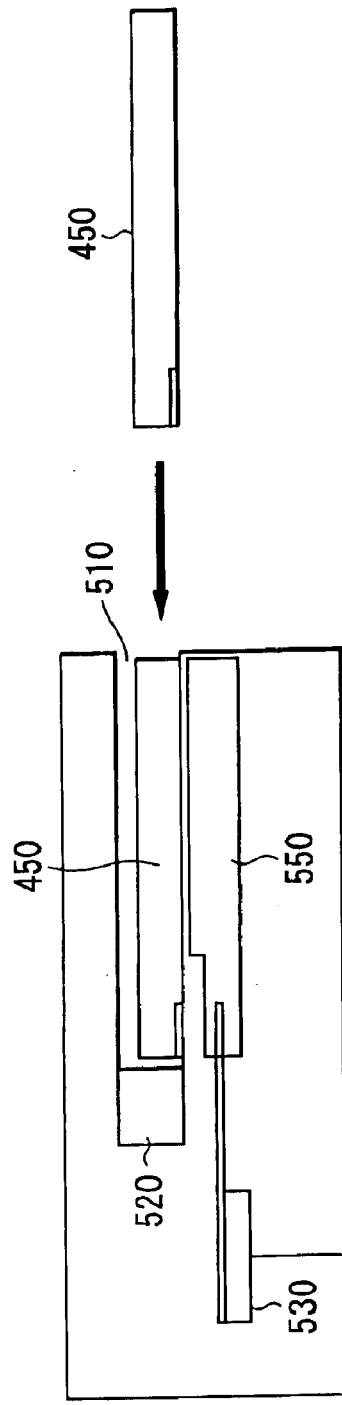
FIG. 31 is a side view of the transfer device in FIG. 30.

FIGS. 30 and 31 are a top view and a side view of a transfer device of card insert type for transferring data on the MRAM card. A second MRAM card 450 used by an end user is inserted from a slit 510 in a transfer device 500, and pushed in until stopped by a stopper 520. The stopper 520 is also used as a member for positioning the first MRAM card 550 and second MRAM card 450. With the second MRAM card 450 disposed at specified position, the data stored in the first MRAM card 550 is transferred into the second MRAM card 450.

Figure 32:
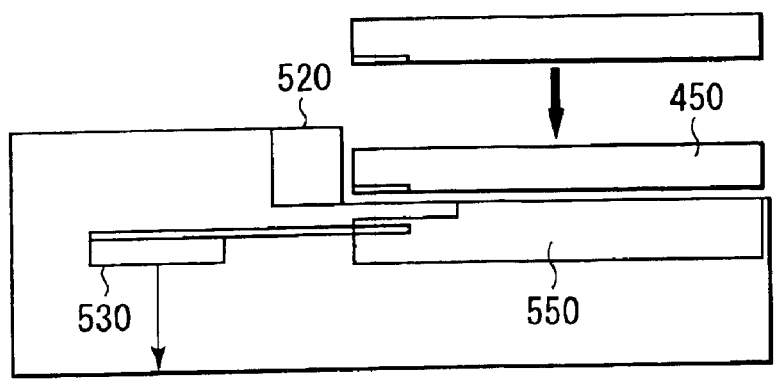
FIG. 32 is a side view of a transfer device of fit-in type for transferring data on the MRAM card in FIG. 29.

FIG. 32 is a side view of a transfer device of fit-in type. As indicated by arrow in the drawing, in this type, aiming at the stopper 520, the second MRAM card 450 is fitted on the first MRAM card 550. The transfer method is same as that in the cart insert type, and explanation is omitted.

Figure 33:
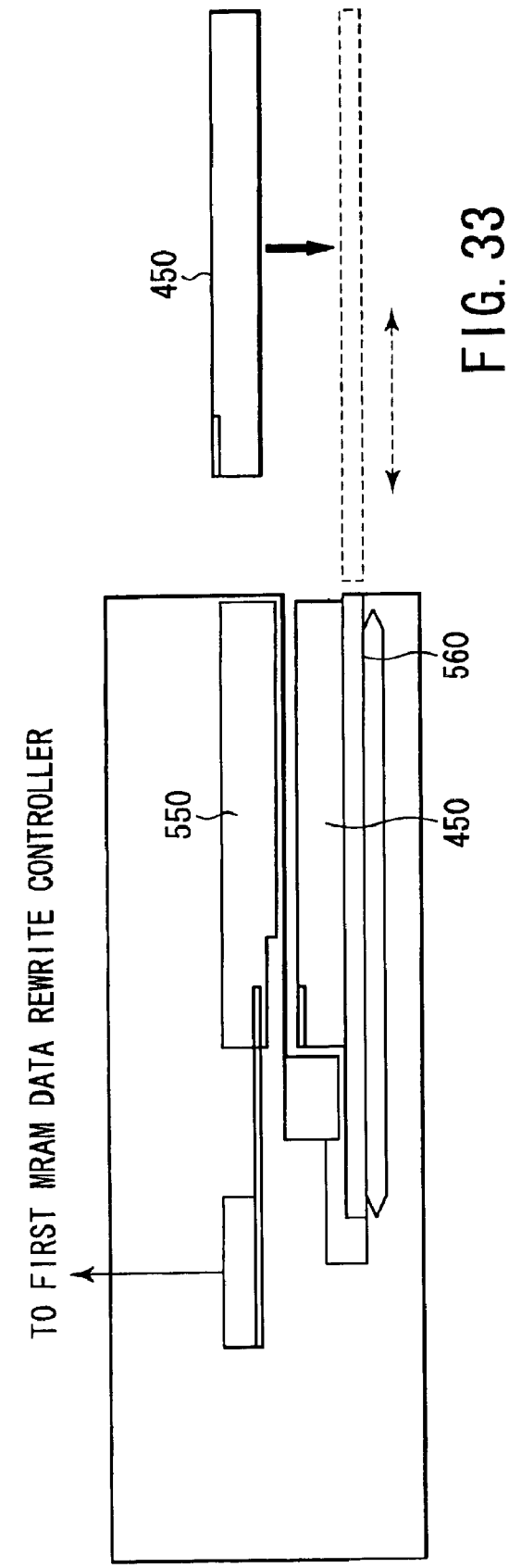
FIG. 33 is a side view of a transfer device of slide type for transferring data on the MRAM card in FIG. 29.

FIG. 33 is a side view of a transfer device of slide type. In the same manner as in the CD-ROM drive or DVD drive, a sliding tray 560 is provided in the transfer device 500, and the sliding tray 560 slides in the horizontal direction as indicated by arrow in the drawing. When the sliding tray 560 moves to the state indicated by the broken line in the drawing, the second MRAM card 450 is put on the sliding tray 560. Then, the sliding tray 560 conveys the second MRAM card 450 into the inside of the transfer device 500. The second MRAM card 450 is conveyed until its leading end hits against the stopper 520, and the data is transferred, same as in the card insert type, and explanation is omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive random access memory device comprising:
   a magnetic memory cell which includes a first magnetoresistive element, a second magnetoresistive element and at least one transfer gate connected in series to the first and second magnetoresistive element,
   each of the first and second magnetoresistive element having a tunnel magnetoresistive effect and the first and second magnetoresistive element being inserted between both ends of the magnetic memory cell;
   a pair of first bit lines connected to the magnetic memory cell;
   a first word line disposed so as to face closely to the magnetic memory cell; and
   a second bit line connected to the magnetic memory cell.

2. The magnetoresistive random access memory device according to claim 1, wherein the first and second magnetoresistive elements hold two data items of opposite logic levels, respectively.

3. The magnetoresistive random access memory device according to claim 1, wherein the pair of first bit lines applies a specific potential difference to both the ends of the magnetic memory cell when reading data, and
   the magnetic memory cell reads the potential determined by a ratio of the combined resistance of the first magnetoresistive element and the second magnetoresistive element to the resistance of the first magnetoresistive element or the second magnetoresistive element onto the second bit line.

4. The magnetoresistive random access memory device according to claim 1, wherein said at least one transfer gate includes a first and a second transfer gate which each have a gate electrode and are connected in series between the first and second magnetoresistive elements,
   the magnetoresistive random access memory further comprising a second word line which is connected to both the gate electrodes of the first and second transfer gates.

5. The magnetoresistive random access memory device according to claim 4, wherein the second word line is activated when reading data.

6. The magnetoresistive random access memory device according to claim 1, wherein said at least one transfer gate includes:
   a first transfer gate which has a gate electrode and is connected between one of both the ends of the magnetic memory cell and the first magnetoresistive element; and
   a second transfer gate which has a gate electrode and is connected between the other of both the ends of the magnetic memory cell and the second magnetoresistive element,
   the magnetoresistive random access memory further comprising a second word line connected to both the gate electrodes of the first and second transfer gates.

7. The magnetoresistive random access memory device according to claim 6, wherein the second word line is activated when reading data.

8. The magnetoresistive random access memory device according to claim 1, wherein said at least one transfer gate includes a first transfer gate which has a gate electrode and is connected between the first magnetoresistive element and the second magnetoresistive element, and a second transfer gate which has one end, the other end, and a gate electrode, with one end connected to a junction point of the first magnetoresistive element and the first transfer gate and the other end connected to the second bit line,
   the magnetoresistive random access memory further comprising:
   a third transfer gate which has one end, the other end, and a gate electrode, with one end connected to a junction point of the second magnetoresistive element and the first transfer gate and the other end connected to the second bit line; and
   a second word line connected to the gate electrodes of the first, second and third transfer gates.

9. The magnetoresistive random access memory device according to claim 8, wherein the second word line is activated when reading data.

10. The magnetoresistive random access memory device according to claim 1, wherein said at least one transfer gate includes a first transfer gate which has a gate electrode and is connected between the first magnetoresistive element and the second magnetoresistive element,
    the magnetoresistive random access memory further comprising:
    a second transfer gate which has a gate electrode and is connected between a junction point of either the first magnetoresistive element or the second magnetoresistive element and the first transfer gate and the second bit line; and
    a second word line connected to the gate electrodes of the first and second transfer gates.

11. The magnetoresistive random access memory device according to claim 10, wherein the second word line is activated when reading data.

12. The magnetoresistive random access memory device according to claim 1, further comprising a sense amplifier which is connected to the second bit line and compares a potential of the second bit line with a reference potential to sense data.

13. The magnetoresistive random access memory device according to claim 12, wherein the reference potential is an intermediate potential between a first potential applied to one of both the ends of the magnetic memory cell and a second potential applied to the other of both the ends of the magnetic memory cell when reading data.

14. The magnetoresistive random access memory device according to claim 12, further comprising a reference potential generator circuit which is connected to the sense amplifier and generates the reference potential.

15. The magnetoresistive random access memory device according to claim 14, wherein the reference potential generator circuit includes a dummy magnetic memory cell which is composed of magnetoresistive elements similar to those in the magnetic memory cell and generates the reference potential, and
  a third bit line onto which the reference potential generated by the dummy magnetic memory cell is read.

16. The magnetoresistive random access memory device according to claim 15, wherein the dummy magnetic memory cell includes:
  a first dummy cell composed of two dummy magnetoresistive elements holding data items of opposite logic levels, respectively;
  a second dummy cell composed of two dummy magnetoresistive elements holding data items of opposite logic levels, respectively, and of reverse logic levels to those logic levels in the first dummy cell; and
  a potential combining circuit to combine the potentials read from the first and second dummy cells and generate the reference potential.

17. The magnetoresistive random access memory device according to claim 15, wherein the dummy magnetic memory cell includes:
  a first dummy cell composed of two dummy magnetoresistive elements holding data items of similar logic levels;
  a second dummy cell composed of two dummy magnetoresistive elements holding data items of similar logic levels reverse logic levels to those logic levels in the first dummy cell; and
  a potential combining circuit to combine the potentials read from the first and second dummy cells and generate the reference potential.

18. The magnetoresistive random access memory device according to claim 1, further comprising:
  a switching circuit which applies a first potential difference between both the ends of the magnetic memory cell in a first period when reading data, and which applies a second potential difference which has the same magnitude as the first potential difference and opposite in polarity to the first potential difference between both the ends of the magnetic memory cell in a second period when reading data; and
  a read circuit which uses the potential read onto the second bit line from the magnetic memory cell in the first period as a reference potential and compares the potential read onto the second bit line from the magnetic memory cell in the second period with the reference potential to sense data.

19. The magnetoresistive random access memory device according to claim 1, further comprising:
  a first switching circuit which applies a first potential difference between both the ends of the magnetic memory cell in a first period when reading data, and which applies a second potential difference which has the same magnitude as the first potential difference and opposite in polarity to the first potential difference between both the ends of the magnetic memory cell in a second period when reading data;
  a second switching circuit which outputs a potential read onto the second bit line from the magnetic memory cell in such a manner that the output is switched between the first period and the second period; and
  a sense amplifier which holds the potential output from the second switching circuit in the first period as a reference potential and compares the potential output from the second switching circuit in the second period with the reference potential to sense data.

20. The magnetoresistive random access memory device according to claim 1, further comprising:
  a switching circuit which applies a first potential difference between both the ends of the magnetic memory cell in a first period when reading data, and which applies a second potential difference which has the same magnitude as the first potential difference and opposite in polarity to the first potential difference between both the ends of the magnetic memory cell in a second period when reading data;
  a first switch element which has one end and the other end, with one end connected to the second bit line, and which is switched on temporarily in the first period and is switched on temporarily in the second period;
  a sense amplifier which is connected to the other end of the first switch element and senses a change in a potential input via the first switch element to sense data; and
  a second switch element which is connected between an input and an output nodes of the sense amplifier and which is switched on in the first period and is switched on temporarily in the second period.

21. A magnetoresistive random access memory device comprising:
  a memory cell array including a plurality of magnetic memory cells arranged in rows and columns, each magnetic memory cell having a first magnetoresistive element, a second magnetoresistive element and at least one transfer gate connected in series to the first and second magnetoresistive elements, each of the first and second magnetoresistive elements having a tunnel magnetoresistive effect and the first and second magnetoresistive elements being inserted between both ends of the magnetic memory cell;
  a plurality of first word lines connected to a plurality of magnetic memory cells provided in each row in the memory cell array;
  a plurality of first bit lines connected to a plurality of magnetic memory cells provided in each column in the memory cell array; and
  a plurality of sense amplifiers which are provided for the individual columns in the memory cell array and are connected to the corresponding ones in a plurality of first bit lines.

22. The magnetoresistive random access memory device according to claim 21, wherein the first and second magnetoresistive elements hold two data items of opposite logic levels, respectively.

23. The magnetoresistive random access memory device according to claim 22, wherein a specific potential difference is applied between both ends of each of said plurality of magnetic memory cells when reading data, and
  each of said plurality of magnetic memory cells reads the potential determined by a ratio of a combined resistance of the first magnetoresistive element and the second magnetoresistive element to the resistance of the first magnetoresistive element or the second magnetoresistive element onto the first bit line.

24. The magnetoresistive random access memory device according to claim 22, wherein said at least one transfer gate includes a first and a second transfer gates which each have a gate electrode and are connected in series between the first and second magnetoresistive elements, the magnetoresistive random access memory further comprising a second word line which is connected to the gate electrodes of the first and second transfer gates and is activated when reading data.

25. The magnetoresistive random access memory device according to claim 22, wherein said at least one transfer gate includes:

a first transfer gate which has a gate electrode and is connected between one of both the ends of the magnetic memory cell and the first magnetoresistive element; and a second transfer gate which has a gate electrode and is connected between the other of both the ends of the magnetic memory cell and the second magnetoresistive element, the magnetoresistive random access memory further comprising a second word line which is connected to the gate electrodes of the first and second transfer gates and is activated when reading data.

26. The magnetoresistive random access memory device according to claim 22, wherein said at least one transfer gate includes a first transfer gate which has a gate electrode and is connected between the first magnetoresistive element and the second magnetoresistive element, the magnetoresistive random access memory further comprising:

a second transfer gate which has one end, the other end, and a gate electrode, with one end connected to a junction point of the first magnetoresistive element and the first transfer gate and the other end connected to the bit line;

a third transfer gate which has one end, the other end, and a gate electrode, with one end connected to a junction point of the second magnetoresistive element and the first transfer gate and the other end connected to the bit line; and a second word line which is connected to the gate electrodes of the first, second and third transfer gates and is activated when reading data.

27. The magnetoresistive random access memory device according to claim 22, wherein said at least one transfer gate includes a first transfer gate which has a gate electrode and is connected between the first and second magnetoresistive elements, the magnetoresistive random access memory further comprising:

a second transfer gate which has a gate electrode and is connected between a junction point of either the first magnetoresistive element or the second magnetoresistive element and the first transfer gate, and the second bit line; and a second word line which is connected to the gate electrodes of the first and second transfer gates and is activated when reading data.

28. The magnetoresistive random access memory device according to claim 22, wherein said plurality of sense amplifiers are connected to said plurality of first bit lines and each compares the potential of the corresponding one of said plurality of first bit lines with the reference potential to sense data.

29. The magnetoresistive random access memory device according to claim 28, wherein the reference potential is an intermediate potential between a first potential applied to one of both the ends of magnetic memory cell and a second potential applied to the other of both the ends of the magnetic memory cell when reading data.

30. The magnetoresistive random access memory device according to claim 28, further comprising a plurality of reference potential generator circuits to generate the reference potential.

31. The magnetoresistive random access memory device according to claim 30, wherein each of said plurality of reference potential generator circuits includes:

a dummy magnetic memory cell which is composed of magnetoresistive elements similar to those in each of said plurality of magnetic memory cells and generates the reference potential; and a second bit line onto which the reference potential generated by the dummy magnetic memory cell is read.

32. The magnetoresistive random access memory device according to claim 31, wherein the dummy magnetic memory cell includes:

a first dummy cell composed of two dummy magnetoresistive elements holding data items of opposite logic levels, respectively;

a second dummy cell composed of two dummy magnetoresistive elements holding data items of opposite logic levels, respectively, and of reverse logic levels to those logic levels in the first dummy cell; and a potential combining circuit to combine the potentials read from the first and second dummy cells to generate the reference potential.

33. The magnetoresistive random access memory device according to claim 31, wherein the dummy magnetic memory cell includes;

a first dummy cell composed of two dummy magnetoresistive elements holding data items opposite logic levels, respectively;

a second dummy cell composed of two dummy magnetoresistive elements holding data items of similar logic levels reverse logic levels to those logic levels in the first dummy cell; and a potential combining circuit to combine the potentials read from the first and second dummy cells to generate the reference potential.

34. The magnetoresistive random access memory device according to claim 28, further comprising a reference potential generator circuit which is connected to said plurality of sense amplifiers and generates the reference potential.

35. The magnetoresistive random access memory device according to claim 34, wherein the reference potential generator circuit is composed of a plurality of dummy magnetic memory cells for a column provided in the memory cell array.

36. The magnetoresistive random access memory device according to claim 23, further comprising a plurality of drivers which are provided for the individual columns in the memory cell array and supply the specific potential difference between both the ends of each of a plurality of magnetic memory cells in each column in the memory cell array before reading data.

37. The magnetoresistive random access memory device according to claim 36, wherein each of said plurality of drivers includes:

a first transistor to apply a first potential to one of both the ends of each of a plurality of magnetic memory cells in each column in the memory cell array; and a second transistor to apply a second potential to the other of both the ends of each of said plurality of magnetic memory cells in each column in the memory cell array.

38. The magnetoresistive random access memory device according to claim 36, wherein each of said plurality of drivers is provided at one end of the memory cell array in the column direction.

39. The magnetoresistive random access memory device according to claim 36, wherein each of said plurality of drivers precharges both the ends of a plurality of magnetic memory cells in each column in the memory cell to specific potentials before reading data.

40. The magnetoresistive random access memory device according to claim 22, wherein each of said plurality of first bit lines is precharged to a specific potential, before reading data.

* * * * *